(12) United States Patent
Ito et al.

(10) Patent No.: US 11,895,886 B2
(45) Date of Patent: *Feb. 6, 2024

(54) DISPLAY DEVICE WITH INSULATING LAYER IN THROUGH HOLE OR NOTCH

(71) Applicant: Japan Display Inc., Tokyo (JP)

(72) Inventors: Masato Ito, Tokyo (JP); Heisuke Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,369

(22) Filed: Jun. 23, 2022

(65) Prior Publication Data
US 2022/0328606 A1    Oct. 13, 2022

Related U.S. Application Data

(63) Continuation of application No. 16/843,982, filed on Apr. 9, 2020, now Pat. No. 11,398,541, which is a continuation of application No. PCT/JP2018/029478, filed on Aug. 6, 2018.

(30) Foreign Application Priority Data

Oct. 13, 2017    (JP) .................................. 2017-199366

(51) Int. Cl.
    *H10K 59/131*    (2023.01)
    *G09G 3/3266*    (2016.01)
    *H10K 50/842*    (2023.01)
    *H10K 59/121*    (2023.01)
    *H10K 102/00*    (2023.01)

(52) U.S. Cl.
CPC ......... *H10K 59/131* (2023.02); *G09G 3/3266* (2013.01); *H10K 50/8426* (2023.02); *H10K 59/121* (2023.02); *H10K 2102/00* (2023.02)

(58) Field of Classification Search
CPC ............... H10K 59/131; H10K 59/121; H10K 50/8426; H10K 2102/00; G09G 3/3266
See application file for complete search history.

(56) References Cited

U.S. PATENT DOCUMENTS 11,398,541 B2 *    7/2022    Ito ........................ H05B 33/04

* cited by examiner

*Primary Examiner* — Lex H Malsawma
(74) *Attorney, Agent, or Firm* — Michael Best & Friedrich LLP

(57) ABSTRACT

A display device according to an embodiment of the present invention has a first substrate, a display region provided with a plurality of pixels on the first substrate, each of the plurality of pixels including a light-emitting element, a driving circuit provided along a first direction of the display region on the first substrate, a sealing film covering the display region, and stacking a first inorganic insulating layer, an organic insulating layer, and a second inorganic insulating layer in order from the light-emitting element, a second substrate on the sealing film, a through hole provided in the first substrate, the display region, and the second substrate; and a first region surrounding the through hole.

14 Claims, 28 Drawing Sheets

DISPLAY DEVICE WITH INSULATING LAYER IN THROUGH HOLE OR NOTCH

CROSS REFERENCE TO RELATED APPLICATIONS

This application is a continuation of U.S. patent application Ser. No. 16/843,982, filed on Apr. 9, 2020. Further, this application is based upon and claims the benefit of priority from the prior Japanese Patent Application No. 2017-199366 filed on Oct. $13^{th}$, 2017, and PCT Application No. PCT/JP2018/029478 filed on Aug. 6, 2018, the entire contents of which are incorporated herein by reference.

FIELD

One embodiment of the present invention relates to the configuration of a display region in a display device.

BACKGROUND

Conventionally, an organic EL display device (Organic Electroluminescence Display Device) in which an organic electroluminescent material (an organic EL material) is used for a light-emitting element (an organic EL device) of a display section has been known as a display device. There is known an organic EL (electroluminescence) display device in which a light emitting element formed by using an organic electroluminescent material is arranged on a display part as a conventional display device. The organic EL display device, unlike Liquid Crystal Display Device and the like, is a so-called self-luminous type display device that realizes displays by causing the organic EL material to emit light.

In recent years, in such an organic EL display device, a deformable display in which a through hole is opened in a display region has been developed. For example, Patent Literature 1 (Japanese Laid-Open Patent Publication No. 2014-235790) discloses an organic EL display device in which a through hole penetrating a display panel is provided in a display region as a vehicle-use display meter. Patent Literature 2 (Japanese Laid-Open Patent Publication No. 2010-179885) discloses a display panel used for a pointer board by providing an opening in a display portion of the display and arranging a needle in the opening.

SUMMARY

A display device according to an embodiment of the present invention has a first substrate, a display region provided with a plurality of pixels on the first substrate, each of the plurality of pixels including a light-emitting element, a driving circuit provided along a first direction of the display region on the first substrate, a sealing film covering the display region, and stacking a first inorganic insulating layer, an organic insulating layer, and a second inorganic insulating layer in order from the light-emitting element, a second substrate on the sealing film, a through hole provided in the first substrate, the display region, and the second substrate; and a first region surrounding the through hole. A width from an end of an opening of the through hole to the plurality of pixels in a second direction intersecting the first direction is greater than a width from an end of the first substrate to an end of the driving circuit in the second region. The first region includes a second region in which the first inorganic insulating layer and the second inorganic insulating layer are provided in contact with each other.

A display device according to an embodiment of the present invention has a first substrate, a display region provided with a plurality of pixels on the first substrate, each of the plurality of pixels including a light-emitting element, a driving circuit provided along a first direction of the display region on the first substrate, a sealing film covering the display region, and stacking a first inorganic insulating layer, an organic insulating layer, and a second inorganic insulating layer in order from the light-emitting element, a second substrate on the sealing film, a notch provided in the first substrate, the display region, and the second substrate, and a first region surrounding the notch. A width from an end of the notch to the plurality of pixels in a second direction intersecting the first direction is greater than a width from an end of the first substrate to an end of the driving circuit in the second region. The first region includes the second region in which the first inorganic insulating layer and the second inorganic insulating layer are provided in contact with each other.

DESCRIPTION OF EMBODIMENTS

Figure 1:
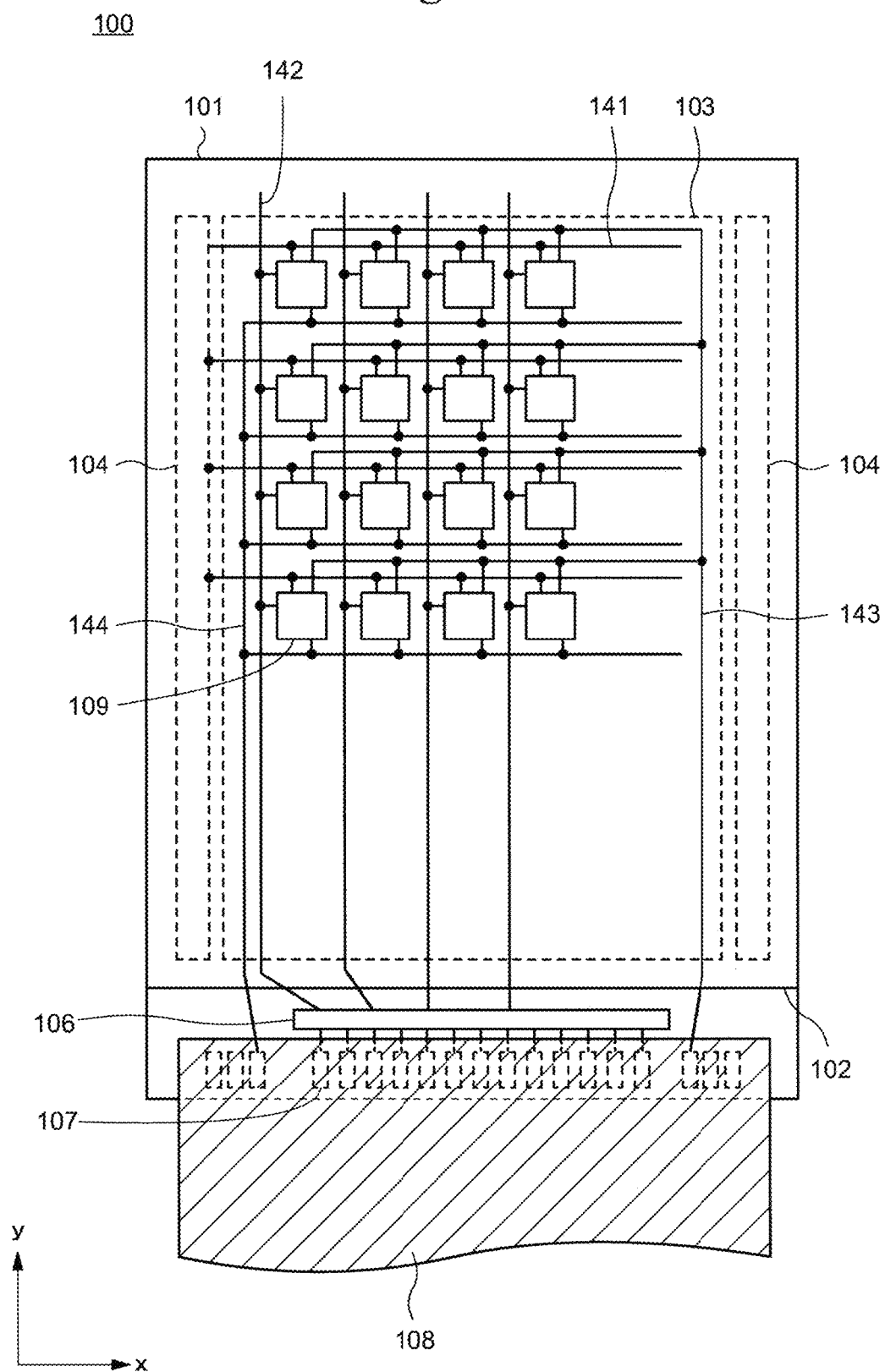
FIG. 1 is a schematic view showing the configuration of a display device according to an embodiment of the present invention.

Embodiments of the present invention will be described below with reference to the drawings and the like. However, the present invention can be implemented in various modes without departing from the gist thereof, and should not be construed as being limited to the description of the following embodiments. In addition, although the width, thickness, shape, and the like of each portion may be schematically represented as compared with actual embodiments in order to clarify the description with respect to the drawings, these schematic diagrams are merely examples and do not limit the interpretation of the present invention. In addition, in the present specification and each of the drawings, the same or similar elements as those described with reference to the preceding drawings are denoted by the same reference numerals, and a repetitive description thereof may be omitted.

In an embodiment of the present invention, when a film is processed to form a plurality of films, the plurality of films may have different functions and roles. However, these plural films are derived from films formed as the same layer in the same process, and have the same layer structure and the same material. Therefore, the plurality of films is defined as being present in the same layer.

In this specification, expressions such as "upper" and "lower" in the description of the drawings represent the relative positional relationship between the structure of interest and other structures. In this specification, in a side view, a direction from first substrate to pixel electrode, which will be described later, is defined as "upper" and the opposite direction is defined as "lower". In the present specification and claims, when expressing a mode of arranging another structure on a certain structure, it is intended to include both the case of arranging the other structure directly above the structure so as to be in contact with the certain structure and the case of arranging the other structure above the certain structure via the still another structure, unless otherwise specified.

When the organic EL element included in organic EL display device is exposed to the air, moisture and oxygen in the air cause degradation of the light emitting layer and cathodes including the organic EL materials and the performance of the element to be deteriorated. When a through hole penetrating through a display panel is formed as disclosed in Japanese Laid-Open Patent Publication No. 2014-235790, moisture and oxygen enters the display panel from a region on which a through hole is formed, thereby deteriorating the organic EL element and reducing the reliability of organic EL display device.

It is an object of one embodiment of the present invention to provide a display device with increased flexibility in visual design. It is another object of an embodiment of the present invention to provide a highly reliable display device by preventing moisture and oxygen from entering the organic EL device.

FIG. 1 is a schematic view showing a configuration of a display device 100 according to an embodiment of the present invention, and shows a schematic configuration when the display device 100 is a planar view. In this specification and the like, a state in which the display device 100 is viewed from a direction perpendicular to a screen (display region) is referred to as "planar view".

As shown in FIG. 1, the display device 100 includes a display region 103, a driving circuit 104, a driver IC 106, and a substrate 102 formed on a substrate 101.

A plurality of pixels 109 is arranged in the display region 103. Each pixel 109 includes a light-emitting element having a pixel electrode (also referred to as an anode), an organic layer (light-emitting portion) including a light-emitting layer stacked layer on the pixel electrode, and a common electrode (also referred to as a cathode), and a pixel circuit connected to the pixel electrode. A plurality of transistors is provided in the pixel circuit. As the transistor, a thin film transistor (Thin Film Transistor: TFT) is typically usable. The transistor is not limited to a thin film transistor, and may be any element having an electric current control function.

The driving circuit 104 is provided along the first direction (the y-direction in FIG. 1) of the display region 103. The driver IC 106 is provided along a second direction (x-direction in FIG. 1) intersecting with the first direction. The driving circuit 104 is connected to a scanning line connected to the pixel 109 and functions as a scanning line driving circuit. In addition, the driver IC 106 is connected to a signal line connected to the pixel 109, and incorporates a signal line driving circuit. Each pixel 109 is supplied with a video signal according to the image data from the driver IC 106 via the signal line. Further, a signal for selecting each pixel 109 is supplied from the driver IC 106 to each of the pixel 109 via the driving circuit 104 and scanning line. With these signals, the transistor included in the pixel circuit can be driven to display images in accordance with the image data. Although, in FIG. 1, the driver IC 106 incorporates the signal line driving circuit, the signal line driving circuit may be provided separately from the driver IC 106.

The driver IC 106 may be provided on the substrate 101 in a form of an IC-chip, or may be provided on a flexible printed circuit board 108. The flexible printed circuit board 108 is connected to a terminal 107 provided in the substrate 101. In addition, in the substrate 101, a region where the driving circuit 104, the driver IC 106, and the terminal 107 are provided so as to surround the display region 103 is a peripheral region 110. The peripheral region 110 surrounds the display region 103 from four sides.

As shown in FIG. 1, the display region 103 is provided with: a plurality of scanning lines 141 and a driving power supply line 143 provided along first direction; and a plurality of signal lines 142 and a reference power supply line 144 provided along a second direction intersecting the first direction. The pixel 109 connected to the scanning line 141, the signal line 142, the driving power supply line 143, and the reference power supply line 144 are arranged in a matrix. Each pixel 109 is supplied with a video signal corresponding to image data from the driver IC 106 via the signal line 142. In addition, a signal for selecting each pixel 109 is supplied from the driver IC 106 to each pixel 109 via the driving circuit 104 and the scanning line 141. With these signals, the transistor included in the pixel circuit can be driven to perform display images in accordance with the image data. Although FIG. 1 shows a state in which pixels are arranged in 4 rows×4 columns, actually, several million pixels are arranged in a matrix.

Figure 2:
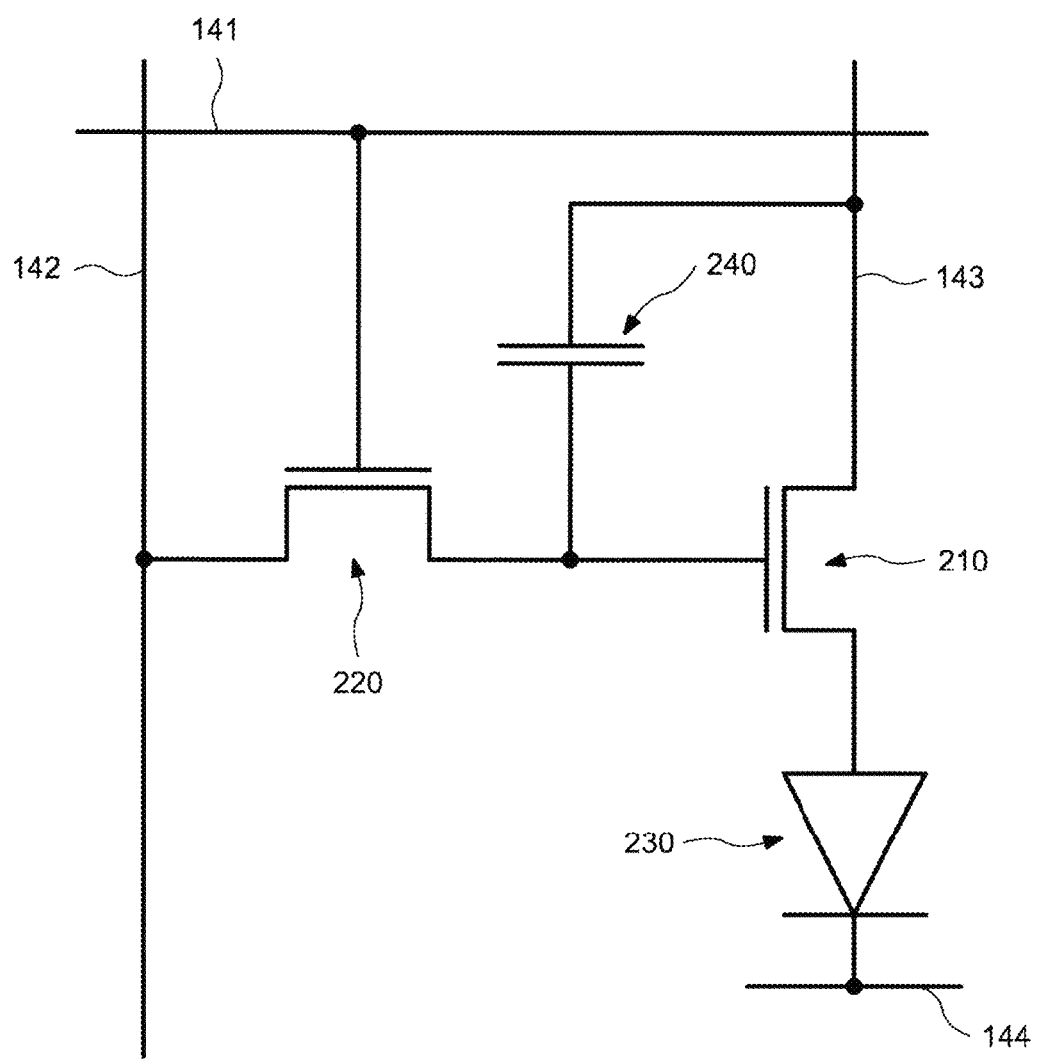
FIG. 2 is a diagram showing a pixel circuit of the display device according to an embodiment of the present invention.

FIG. 2 shows the pixel circuit of the pixel 109 provided in the display region 103. The pixel 109 includes at least a transistor 210, a transistor 220, a light-emitting element 230, and a storage capacitor 240.

The transistor 210 functions as a drive transistor. That is, the transistor is connected to the light-emitting element 230 and controls the luminance of the light-emitting element 230. The transistor 210 has a gate connected to the transistor 220, a source connected to the driving power supply line 143, and a drain connected to the pixel electrode of the light-emitting element 230. The drain current of the transistor 210 is controlled by a gate-source voltage.

The transistor 220 functions as a selection transistor. That is, the transistor 220 controls the conduction between the signal line 142 and the gates of the transistor 210. The transistor 220 has the gate connected to the scanning line 141, the source connected to the signal line 142, and the drain connected to the gate of the transistor 210.

The light-emitting element 230 has the pixel electrode connected to the drain of the transistor 210 and a common electrode connected to the reference power supply line 144.

The storage capacitor 240 has a first electrode connected to the source of the transistor 210 and a second electrode connected to the gate of the transistor 210. Thus, the storage capacitor 240 holds the gate-source voltages of the transistor 210.

Figure 3:
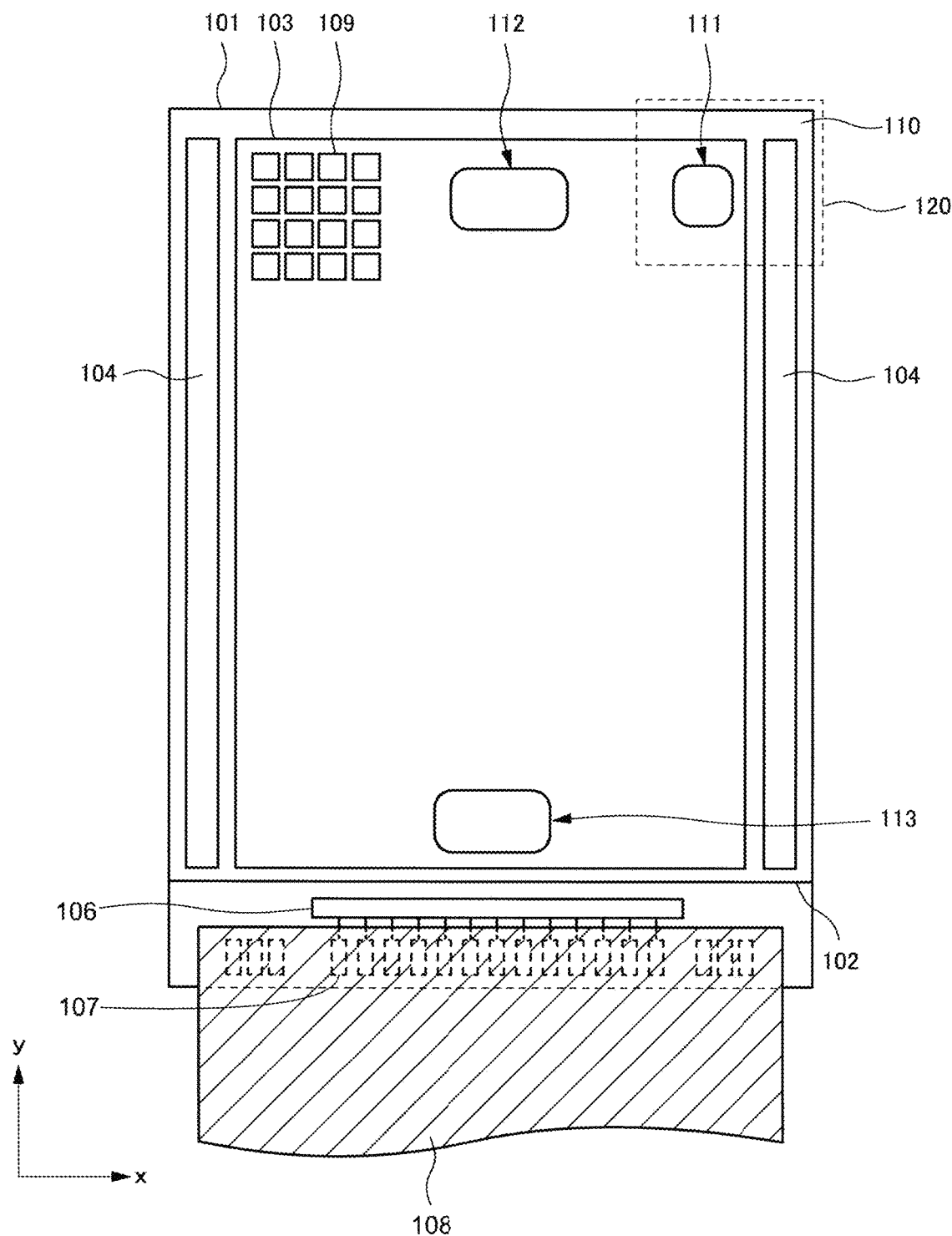
FIG. 3 is a schematic view showing the configuration of the display device according to an embodiment of the present invention.

The display device 100 according to this embodiment includes at least one through hole in the display region 103. In FIG. 3, a through hole 111, a through hole 112, and a through hole 113 are provided at three positions of the display region 103. The through hole 111 passes through the substrate 101, the display region 103, and the substrate 102. The through hole 112 and the through hole 113 pass through the substrate 101, the display region 103, and the substrate 102 as same as the through hole 111.

Figure 4:
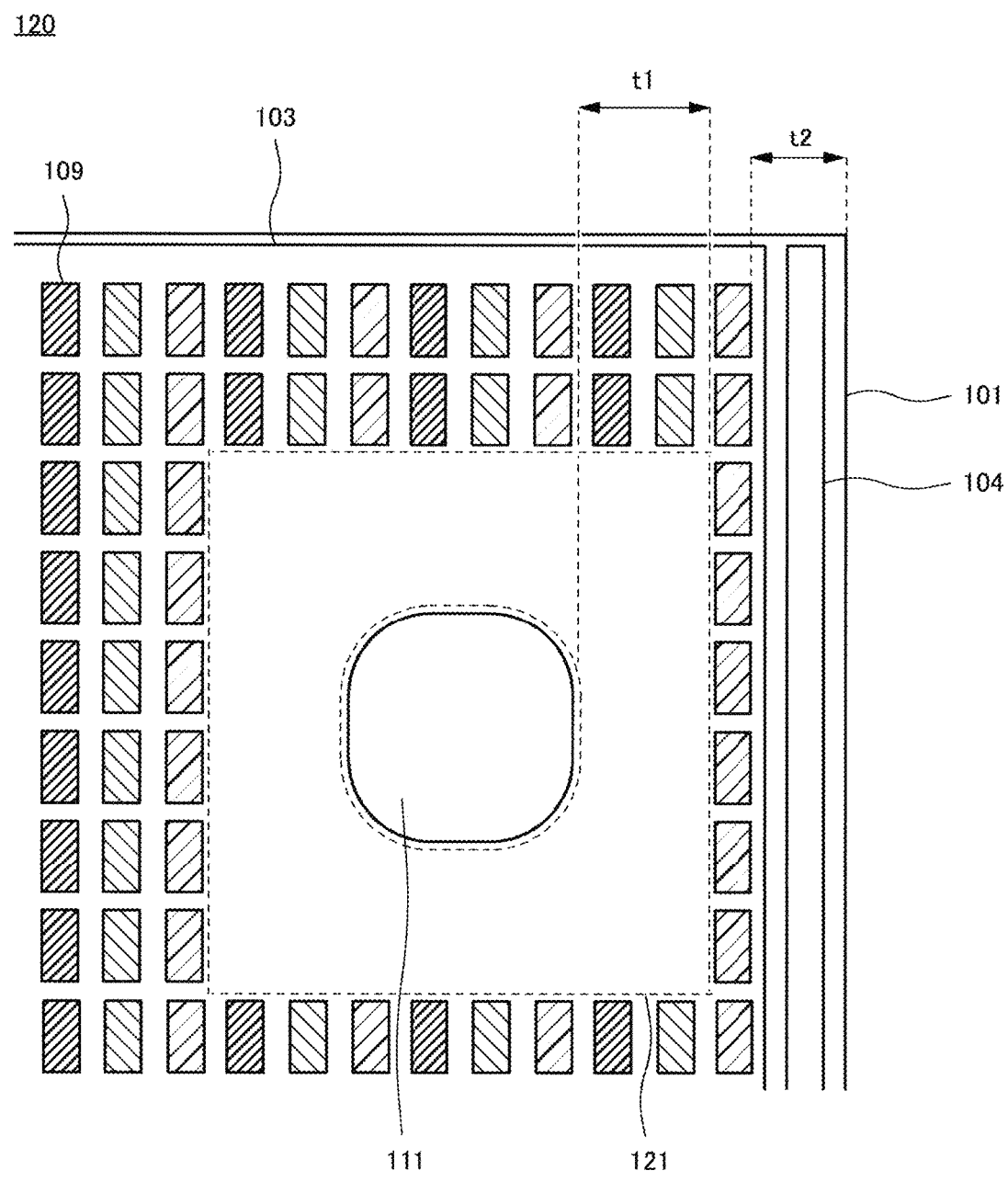
FIG. 4 is an enlarged view of a part of the display device shown in FIG. 3.

FIG. 4 shows an enlarged view of a region 120 shown in FIG. 1. The region 120 includes the display region 103, the driving circuit 104, the through hole 111, and a region 121 surrounding the through hole 111. The region 121 surrounding the through hole 111 refers to a region surrounded by the edge of the opening of the through hole 111 and the plurality of pixels 109 in planar view. In the display region 103, the plurality of pixels 109 is arrayed in a matrix.

Figure 5:
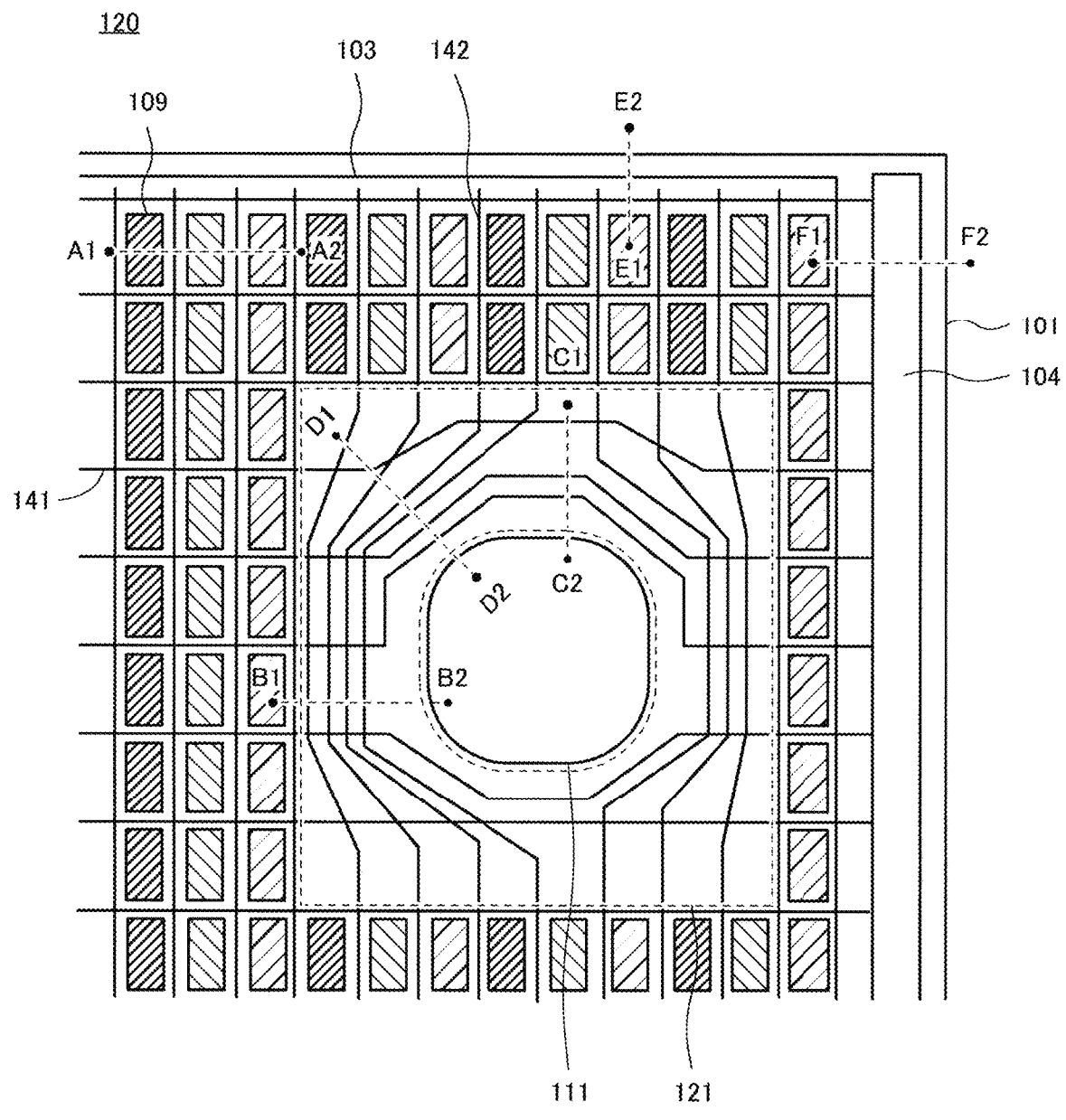
FIG. 5 is an enlarged view of a part of the display device shown in FIG. 3.

FIG. 5 is a diagram in which the plurality of scanning lines 141 and the plurality of signal lines 142 are added to the enlarged view of the region 120 shown in FIG. 4. The plurality of scanning lines 141 is electrically connected to the pixel 109, and the signal line 142 is electrically connected to the pixel 109.

As shown in FIG. 5, in the region 121 surrounding the through hole 111, the plurality of scanning lines 141 is connected to the left and right pixels 109 with respect to the through hole 111, bypassing the through hole 111. The plurality of signal lines 142 is also connected to the upper and lower pixels 109 with respect to the through hole 111, bypassing the through hole 111. As a result, even when the through hole pass through the substrate 101 and the substrate 102 is provided in the display region 103, the video signal can be normally output to the display region 103.

As shown in FIG. 5, a width t1 of the region 121 in the second region (in the x-direction in FIG. 4) is larger than a width t2 from an end of the substrate 101 to an end of the pixel 109 in the first direction. Depending on the area of the through hole 111, the region 121 surrounding the through hole 111 is provided with wirings of several tens to hundreds, by bypassing the through hole 111, whereas the width from the ends of the substrate 101 to ends of the driving circuit 104 are provided with wirings of several to tens or so, and the transistor of the driving circuit 104 or the like. This is because the width t1 is larger than the width t2 even if the layout area of the transistor or the like is considered because the wirings of several times or more of the number of wirings arranged in the region of the width t2 are provided in the region of the width t1.

<Configuration of the Pixel>

Next, the configuration of the pixel 109 of the display device 100 will be described with reference to FIG. 6.

Figure 6:
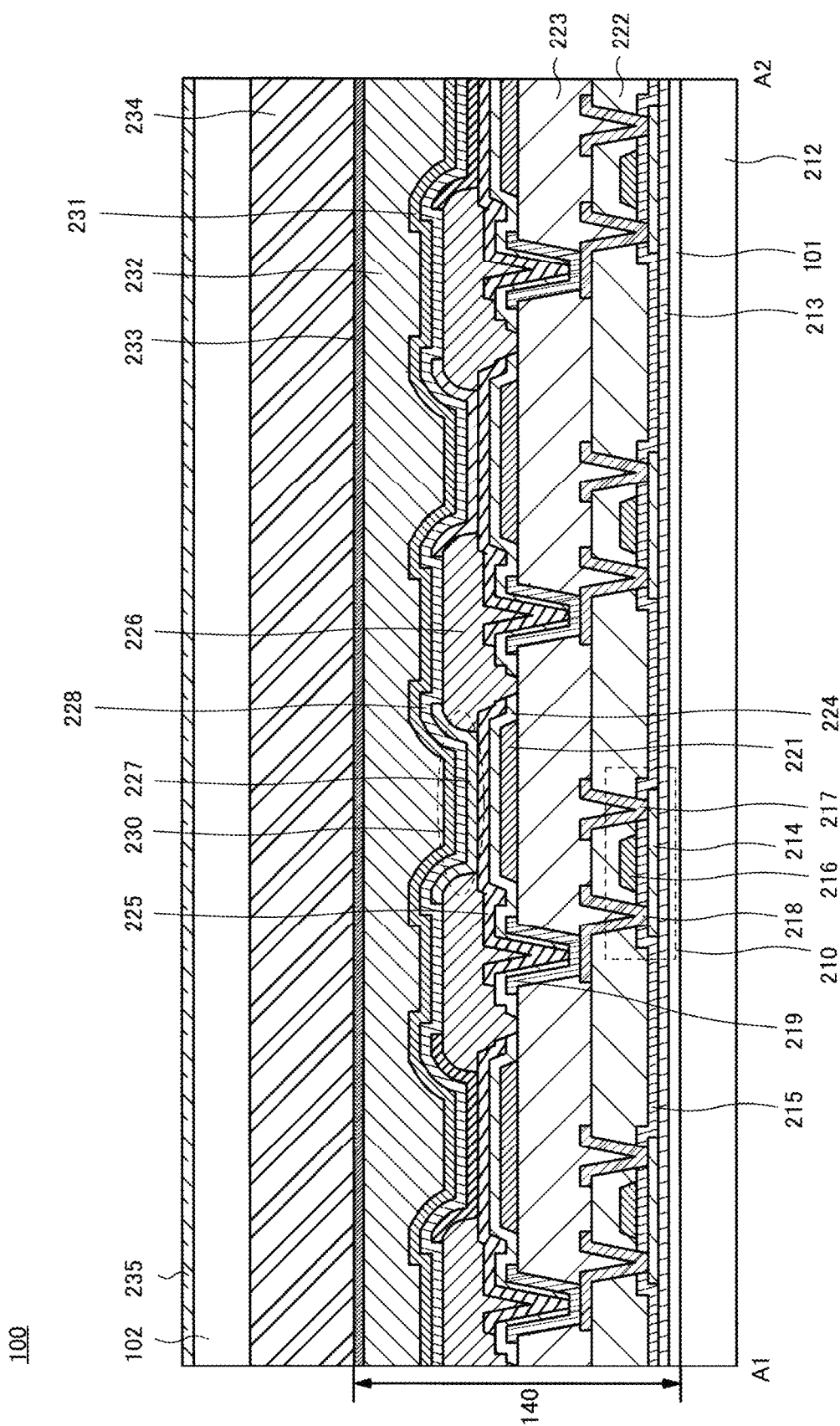
FIG. 6 is a cross-sectional view taken along line A1-A2 of the display region shown in FIG. 5.

FIG. 6 shows a cross-sectional view taken along an A1-A2 line of the display device 100 shown in FIG. 5. FIG. 6 shows a cross-section of the three pixels 109.

As shown in FIG. 6, the display device 100 includes the substrate 101, a substrate 212, and the substrate 102. Usable as the substrate 101, the substrate 102, and the substrate 102 may be a glass substrate, a silica substrate, a flexible substrate (polyimides, polyethylene terephthalate, polyethylene naphthalate, triacetyl cellulose, cyclic olefin copolymers, cycloolefin polymers, and other flexibility bearing resins substrates). In the case where the substrate 101, the substrate 212, and the substrate 102 do not need to be translucent, the substrate 101, the substrate 212, and the substrate 102 may be a metallic substrate, a ceramic substrate, or a semiconducting substrate. In this embodiment, a case where polyimide is used as the substrate 101, and polyethylene terephthalate is used as the substrate 212 and the substrate 102.

An under film 213 is provided on the substrate 101. The under film 213 is an insulating film composed of inorganic materials such as silicon oxide, silicon nitride, and aluminum oxide. The under film 213 is not limited to a single layer, and may include, for example, a stacked structure in which a silicon oxide layer and a silicon nitride layer are combined. This configuration may be appropriately determined considering the adhesion to the substrate 101 and the gas-barrier property to the transistor 210, which will be described later.

The transistor 210 is provided on the under film 213. The transistor 210 may be used to either in a top-gate type or a bottom-gate type. In FIG. 1, the transistor 210 is the top-gate type, and the transistor 210 includes a semiconductor layer 214 provided on the under film 213, a gate insulating film 215 covering the semiconductor layer 214, and a gate electrode 216 provided on the gate insulating film 215. In addition, an interlayer insulating film 222 covering the gate electrode 216 is provided on the transistor 210. In addition, a source or drain electrode 217 and a source or drain electrode 218 are provided on the interlayer insulating film 222. Each of the source or drain electrodes 217 and 218 is connected to the semiconductor layer 214. In this embodiment, the interlayer insulating film 222 has a single-layer structure. Alternatively, the interlayer insulating film 222 may have a stacked structure.

Note that a material of each layer included in the transistor 210 may be a known material and is not particularly limited. For example, usable as the semiconductor layer 214 may typically be polysilicon, amorphous silicon, or oxide semiconductor. Usable as the gate insulating film 215 may be silicon oxide or silicon nitride. The gate electrode 216 is formed of a metal material such as copper, molybdenum, tantalum, tungsten, aluminum, or the like. Usable as the interlayer insulating film 222 may be silicon oxide or silicon nitride. Each of the source or drain electrodes 217 and 218 is formed of a metallic material such as copper, titanium, molybdenum, aluminum, or the like.

Although not shown in FIG. 6, the scanning line 141 is formed of the same metal material as the metal material forming the gate electrode 216 can be provided in the same layer as the gate electrode 216. Also, although not shown in FIG. 6, the signal line 142 extending in a direction intersecting with the scan line 141 can be provided in the same layer as the source or drain electrode 217 and the source or drain electrode 218.

A planarization film 223 is provided over the transistor 210. The planarization film 223 includes an organic resin material. As the organic resin material, for example, a known organic resin material such as polyimide, polyamide, acrylic, or epoxy can be used. The planarization film 223 of such a material may be formed by a solution application method, and have a high effect of flattening. Although not specifically shown, the planarization film 223 is not limited to having a single-layer structure, and may have a stack structure of an organic insulating layer and an inorganic insulating layer.

The planarization film 223 has a contact hole exposing a part of the source or drain electrode 218. The contact hole is an opening for electrically connecting a pixel electrode 225 described below and the source or drain electrode 218. Therefore, the contact hole is provided so as to overlap with a part of the source or the drain electrode 218. In bottom surface of the contact hole, the source or drain electrode 218 is exposed.

A transparent conductive layer 219 is provided in the contact hole provided in the planarization film 223. The transparent conductive layer 219 overlaps with the contact hole of the planarization film 223 and is electrically connected to the source or drain electrode 218 exposed at bottom surface of the contact hole. Usable as the transparent conductive layer 219 may be an indium-oxide-based transparent conductive layer (e.g., ITO) or a zinc-oxide-based transparent conductive layer (e.g., IZO, ZnO).

In addition, a conductive layer 221 is provided on the planarization film 223. The conductive layer 221 may be formed of materials similar to the source or drain electrode 217 and the source or drain electrode 218 and may be formed of, for example, a three-layer construction of molybdenum, aluminum, and molybdenum. The conductive layer 221 is used to form a leading wiring in the peripheral region 110 and an additional capacity element in the pixel 109. By providing the transparent conductive layer 219 over the source or drain electrode 218, the source or drain electrode 218 can be protected from patterning in forming the conductive layer 221.

An inorganic insulating layer 224 is provided on the transparent conductive layer 219. A silicon nitride film or the like is preferably used as the inorganic insulating layer 224. A contact hole is formed in the inorganic insulating layer 224 in a region where the source or drain electrode 218 and the transparent conductive layer 219 overlap with each other.

The pixel electrode 225 is provided on the inorganic insulating layer 224. The pixel electrode 225 is connected to the transparent conductive layer 219 via the contact hole provided in the inorganic insulating layer 224. Thus, the pixel electrode 225 is electrically connected to the source or drain electrode 218. In the display device 100 according to this embodiment, the pixel electrode 225 functions as an anode in the light-emitting element 230. The pixel electrode 225 has a different structure depending on whether it is a top emission type or a bottom emission type. For example, in the case where the display device 100 is of the top emission type, the pixel electrode 225 is formed of a metal material having a high reflectance or formed to have a stack structure of a transparent conductive layer having a high work function such as an indium oxide-based transparent conductive layer (i.e., ITO), a zinc oxide-based transparent conductive layer (i.e., IZO, ZnO) or the like and a metal film. On the other hand, in the case where the display device 100 is of the bottom emission type, the pixel electrode 225 is formed of any of the above-listed transparent conductive layers. In this embodiment, the display device 100 is of a top emission type organic EL display device will be exemplified. Further, the conductive layer 221, the inorganic insulating layer 224, and the pixel electrode 225 can form an additional capacitor.

In this embodiment, the structure in which the transparent conductive layer 219 is provided in the contact hole has been described. The present invention is not limited to this. Without providing the transparent conductive layer 219 in the contact hole, the source or drain electrode 218 may be directly connected to the pixel electrode 225 in the contact hole. The conductive layer 221 and the inorganic insulating layer 224 may be omitted.

An insulating layer 226 form of an organic resin material is provided on the pixel electrode 225. Usable as the organic resin material may be formed of a known resin material such as polyimide, polyamide, acrylic, epoxy, or siloxane. The insulating layer 226 has the opening on a portion of the pixel electrode 225. The insulating layer 226 is provided between the pixel electrode 225 adjacent to each other so as to cover an end portion (an edge portion) of the pixel electrode 225, and functions as a member for separating the adjacent the pixel electrode 225. Therefore, the insulating layer 226 is generally referred to also as a "barrier" and a "bank". A part of the pixel electrode 225 exposed from the insulating layer 226 serves as a light emitting region of the light-emitting element 230. The opening of the insulating layer 226 is preferably formed such that the inner wall has a tapered shape. As a result, this may decrease a coverage fault in the edge of the pixel electrode 225 at the time of formation of an organic layer described below. The insulating layer 226 may not only cover the end of the pixel electrode 225 but may also function as a filler for filling a concave portion cause by the contact hole included in the planarization film 223. The planarization film 223 has a region in contact with the insulating layer 226 through an opening provided in the inorganic insulating layer 224. This is an opening for extracting water and degassed from the planarization film 223 by the heat treatment through the insulating layer 226.

An organic layer 227 is provided on the pixel electrode 225. The organic layer 227 has the light-emitting layer formed of at least organic materials and functions as a light-emitting portion of the light-emitting element 230. The organic layer 227 may include various charge transport layers such as a hole injection layer and/or a hole transport layer, an electron injection layer and/or an electron transport layer, in addition to the light emitting layer. The organic layer 227 is provided so as to cover the light emitting region, that is, to cover the opening of the insulating layer 226 in the light emitting region.

In this embodiment, the organic layer 227 includes the light-emitting layer that emits light of a desired color, and the organic layer 227 including the different light-emitting layer is formed over each of the pixel electrode 225 so that each color of R, G, and B is displayed. That is, in this embodiment, the light emitting layer of the organic layer 227 is discontinuous between the adjacent pixel electrodes 225. Although not shown, the hole injection layer and/or the hole transport layer, the electron injection layer and/or the electron transport layer may be continuously provided between adjacent the pixel electrode 225. Usable as the organic layer 227 may be a well-known structure or a well-known material, and the structure is not particularly limited to the structure of this embodiment. In addition, the organic layer 227 may have the light emitting layer that emits white light, and may display each color of R, G, and B through a color filter. In the case, the organic layer 227 may also be provided on the insulating layer 226.

A common electrode 228 is provided on the organic layer 227 and the insulating layer 226. The common electrode 228 functions as the common cathode constituting the light-emitting element 230. Since the display device 100 of this embodiment is of the top emission type, a transparent electrode is used as the common electrode 228. Usable as the thin film constituting the transparent electrode may be an MgAg thin film or the transparent conductive layer (ITO or IZO). The common electrode 228 is also provided on the insulating layer 226 across the respective pixel 109. The common electrode 228 is electrically connected to the external terminal via a lower conductive layer in a peripheral region near the end of the display region 103. As described above, in this embodiment, the light-emitting element 230 is configured by the part (anode) of the pixel electrode 225 exposed from the insulating layer 226, the organic layer 227 (light-emitting portion), and the common electrode 228 (cathode).

As shown in FIG. 6, an inorganic insulating layer 231, an organic insulating layer 232, and an inorganic insulating layer 233 are provided over the display region 103. The inorganic insulating layer 231, the organic insulating layer 232, and the inorganic insulating layer 233 function as a sealing film for preventing moisture and oxygen from entering the light-emitting element 230. By providing the sealing film over the display region 103, entry of water and oxygen into the light-emitting element 230 can be prevented, so that the reliability of the display device can be improved. Usable as the inorganic insulating layer 231 and the inorganic insulating layer 233 may be, for example, silicon nitride ($Si_xN$), silicon oxide nitride ($SiO_xN_y$), silicon nitride ($SiN_xO_y$), aluminum oxide ($Al_xO_y$), aluminum nitride ($Al_xN_y$), aluminum oxide nitride ($Al_xO_yN_z$), such as aluminum nitride ($Al_xN_yO_z$) (x, y, z is optional). Further, usable as the organic insulating layer 232 may be a polyimide resin, acrylic resin, epoxy resin, silicone resin, fluororesin, siloxane resin or the like. Note that the sealing film is not limited to the three layers of the inorganic insulating layer 231, the organic insulating layer 232, and the inorganic insulating layer 233 described above, and may be configured by appropriately combining inorganic insulating layer and organic insulating layer.

Compared to the inorganic material, the organic material tend to provide a route for the entry of moisture and oxygen. Therefore, it is preferred that the organic material is not exposed in a region where the display device 100 comes into contact with air. However, the inorganic material has a lower flexibility than the organic material, so that cracks are likely to occur. This crack may be a path for moisture and oxygen to enter.

Therefore, the organic insulating layer 232 is provided at least in a region where the light-emitting element 230 is provided, and in other regions, the inorganic insulating layer 231 and the inorganic insulating layer 233 are provided in contact with each other. The display device 100 can suppress entry of moisture and oxygen while maintaining flexibility. In the display device 100, an adhesive member 234 made of an organic material is used for bonding an array substrate 140 and the substrate 102. Even if moisture or oxygen enters the display region 103 from the adhesive member 234, the sealing film can prevent entry of the light-emitting element.

As described above, in this specification and the like, the structure from the substrate 101 to the inorganic insulating layer 233 (sealing film) are referred to as the array substrate 140.

The adhesive member 234 is provided on the inorganic insulating layer 233. Usable as the adhesive member 234 may be for example, an acrylic-based, rubber-based, silicone-based, or urethane-based adhesive member. The adhesive member 234 may contain a water absorbing substance such as calcium, zeolites, or the like. The water-absorbing substance contained in the pressure-sensitive adhesive member 234 may delay arrival of moisture to the light emitting element 230 even if the moisture enters the inside of the display device 100. Further, a spacer may be provided in the adhesive member 234 to secure a gap between the substrate 101 and the substrate 102. Such the spacer may be mixed with the adhesive member 234 or may be formed on the substrate 101 using resin or the like.

For example, the substrate 102 can be provided with an overcoat layer for planarization. When the organic layer 227 emits white light, the substrate 102 may be provided with a color filter corresponding to each of RGB colors on a main surface (a surface facing the substrate 101) and a black matrix provided between the color filters. When the color filter is not formed on the substrate 102, for example, the color filter may be formed directly on the sealing film, and the adhesive member 234 may be formed on the color filter.

A polarization plate 235 is provided on the rear surface (display surface side) of the substrate 102. The polarization plate 235 is, for example, a circular polarization plate. The substrate 102 may be omitted, and the circular polarization plate may be attached to array substrate via an adhesive. In other words, the substrate 102 may be the circle polarization plate.

<Region Including a Though Hole>

Next, the configuration of the region 121 surrounding the through hole 111 will be described, with reference to FIG. 7 to FIG. 11.

Figure 7:
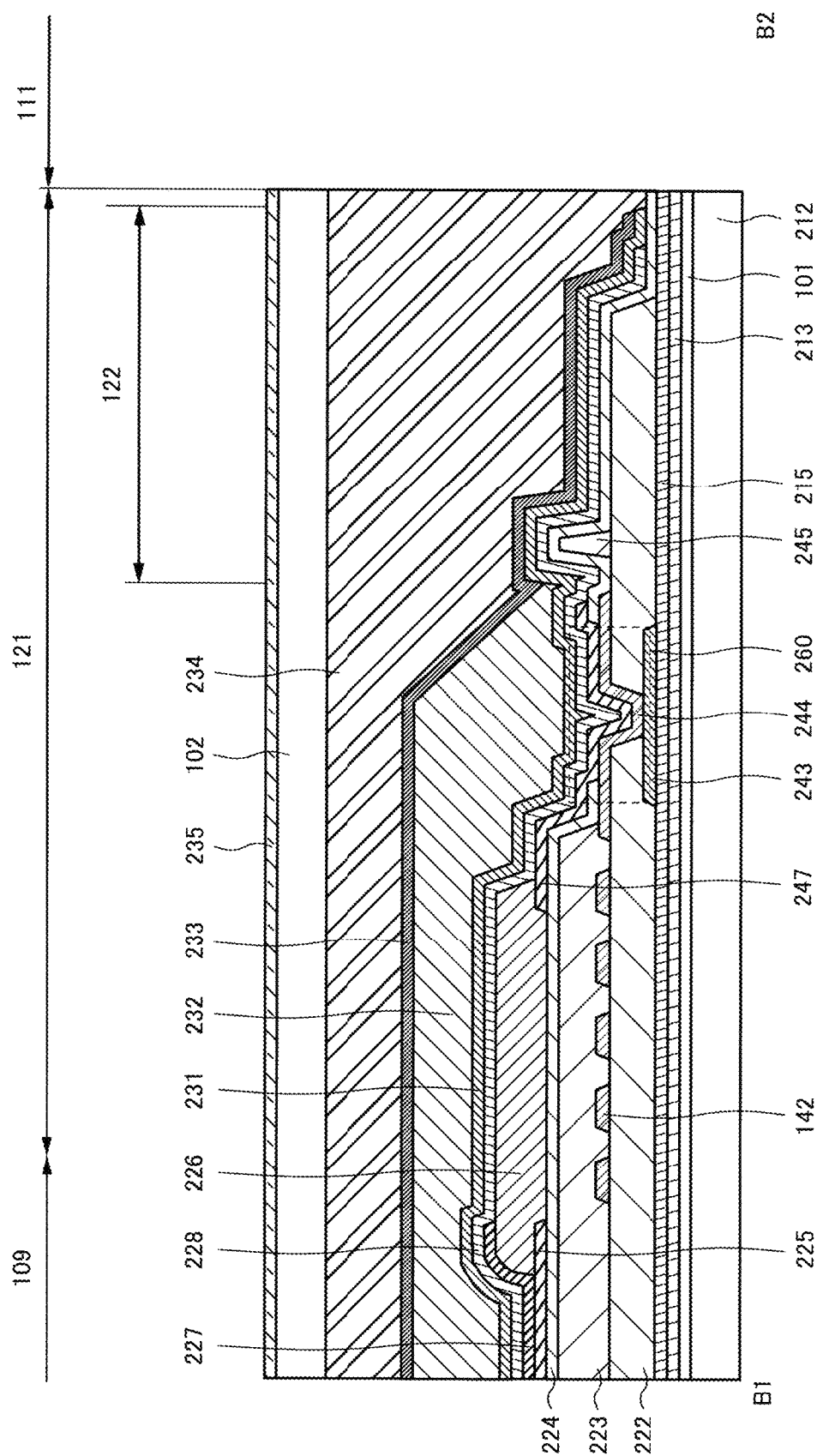
FIG. 7 is a cross-sectional view taken along line B1-B2 of the display region shown in FIG. 5.

FIG. 7 is a cross-sectional view taken along B1-B2 line of the display device 100 shown in FIG. 5. FIG. 7 shows a cross-sectional view of the through hole 111, the region 121 surrounding the through hole 111, and the pixel 109.

As shown in FIG. 7, in the region 121 surrounding the through hole 111, a conductive layer 243 is provided on the gate insulating film 215. The conductive layer 243 is formed from the same conductive film as the gate electrode 216 shown in FIG. 6. The interlayer insulating film 222 is provided on the conductive layer 243. The interlayer insulating film 222 has a region that is not provided at the opening edge of the through hole 111. The plurality of signal lines 142 bypassing the through hole 111 is provided on the interlayer insulating film 222. A conductive layer 244 and the conductive layer 243 are connected to each other through an opening provided in the interlayer insulating film 222. The plurality of signal lines 142 and the conductive layer 244 are formed of the same conductive film as the source or drain electrode 217 and the source or drain electrode 218 shown in FIG. 6.

The planarization film 223 is provided on the interlayer insulating film 222 and the signal line 142. In addition, a protruding portion 245 protruding in a direction toward the inorganic insulating layer 231 is provided on the interlayer insulating film 222. The protruding portion 245 is formed of the same materials as the planarization film 223. In planar view, the plurality of protruding portions 245 is provided along the outer periphery of the through hole 111. One protruding portion 245 may be provided annularly along the outer periphery of the through hole 111. One protruding portion 245 may be provided annularly along the outer periphery of the through hole 111 between the protruding portion 245 and the through hole 111.

The inorganic insulating layer 224 is provided on the planarization film 223. The inorganic insulating layer 224 is provided so as to cover the end portion of the planarization film 223 and the protruding portion 245. By providing the inorganic insulating layer 224 so as to cover the end portion of the planarization film 223, water and oxygen can be prevented from entering from the end portion of the planarization film 223. As a result, the light emitting element 230 included in the pixel 109 can be prevented from being deteriorated by water and oxygen.

A conductive layer 247 is provided on the inorganic insulating layer 224. The conductive layer 247 is connected to the conductive layer 244 via the opening provided in the inorganic insulating layer 224. The conductive layer 247 is formed of the same conductive film as the pixel electrode 225. The insulating layer 226 is provided on the inorganic insulating layer 224 and the conductive layer 247. The insulating layer 226 covers the end of the pixel electrode 225 and the end of the conductive layer 247.

The common electrode 228 is provided on the insulating layer 226, the conductive layer 247, and the inorganic insulating layer 224. The common electrode 228 is connected to the conductive layer 247. Thus, region where the common electrode 228 and the conductive layer 247 are connected is a cathode contact 260. The cathode contact 260 is provided to prevent the resistivity of the common electrode 228 from increasing. By providing the cathode contact 260 in region of the through hole 111, it is possible to suppress an increase in the resistivity of the common electrode 228 around the through hole 111. The conductive layer 243 functions as a lead wiring.

On the common electrode 228, the inorganic insulating layer 231, the organic insulating layer 232, and the inorganic insulating layer 233 are provided in this order. The inorganic insulating layer 231 is provided on the entire surface of the region 121 surrounding the pixel 109 and the through hole 111. The organic insulating layer 232 is provided in the vicinity of the light-emitting element 230 and the protruding portion 245. The inorganic insulating layer 233 is provided on the organic insulating layer 232 and the inorganic insulating layer 231.

The organic insulating layer 232 is provided in the vicinity of the light-emitting element 230 and the protruding portion 245. The inorganic insulating layer 231 is in contact with the inorganic insulating layer 233 in a region from the protrusion 245 to the edge of the opening of the through hole 111. A region where the inorganic insulating layer 231 and the inorganic insulating layer 233 are in contact with each other is referred to as a sealing region 122. The region where the inorganic insulating layer 231 and the inorganic insulating layer 233 are in contact with each other has higher adhesiveness than region in which the inorganic insulating layer 231 and the organic insulating layer 232 are in contact with each other. Therefore, by providing the sealing region 122 in contact with the inorganic insulating layer 231 and the inorganic insulating layer 233, moisture and oxygen can be prevented from entering from the opening edge of the through hole 111 while maintaining the flexibility of the display device 100. In addition, the protruding portion 245 has a function of damming the organic insulating layer 232 when forming the organic insulating layer 232. Therefore, the organic insulating layer 232 does not overlap with the protruding portion 245.

In the sealing region 122, the common electrode 228 is provided near the opening edge of the through hole 111. When the end of the common electrode 228 is exposed at an opening of the through hole 111, the common electrode 228 corrodes and the potential variation. Therefore, by covering the end portion of the common electrode 228 with the inorganic insulating layer 231, it is possible to suppress the common electrode 228 from being corroded. In particular, when the common electrode 228 is formed by vapor deposition, the density of the common electrode 228 is low, and moisture and oxygen are easily transmitted. Therefore, external oxygen or moisture may reach the organic layer 227 of the pixel via the common electrode 228 and adversely affect the organic layer 227. As described above, by covering the edge of the common electrode 228 with the inorganic insulating layer 231, the occurrence of this problem can be suppressed.

Figure 8:
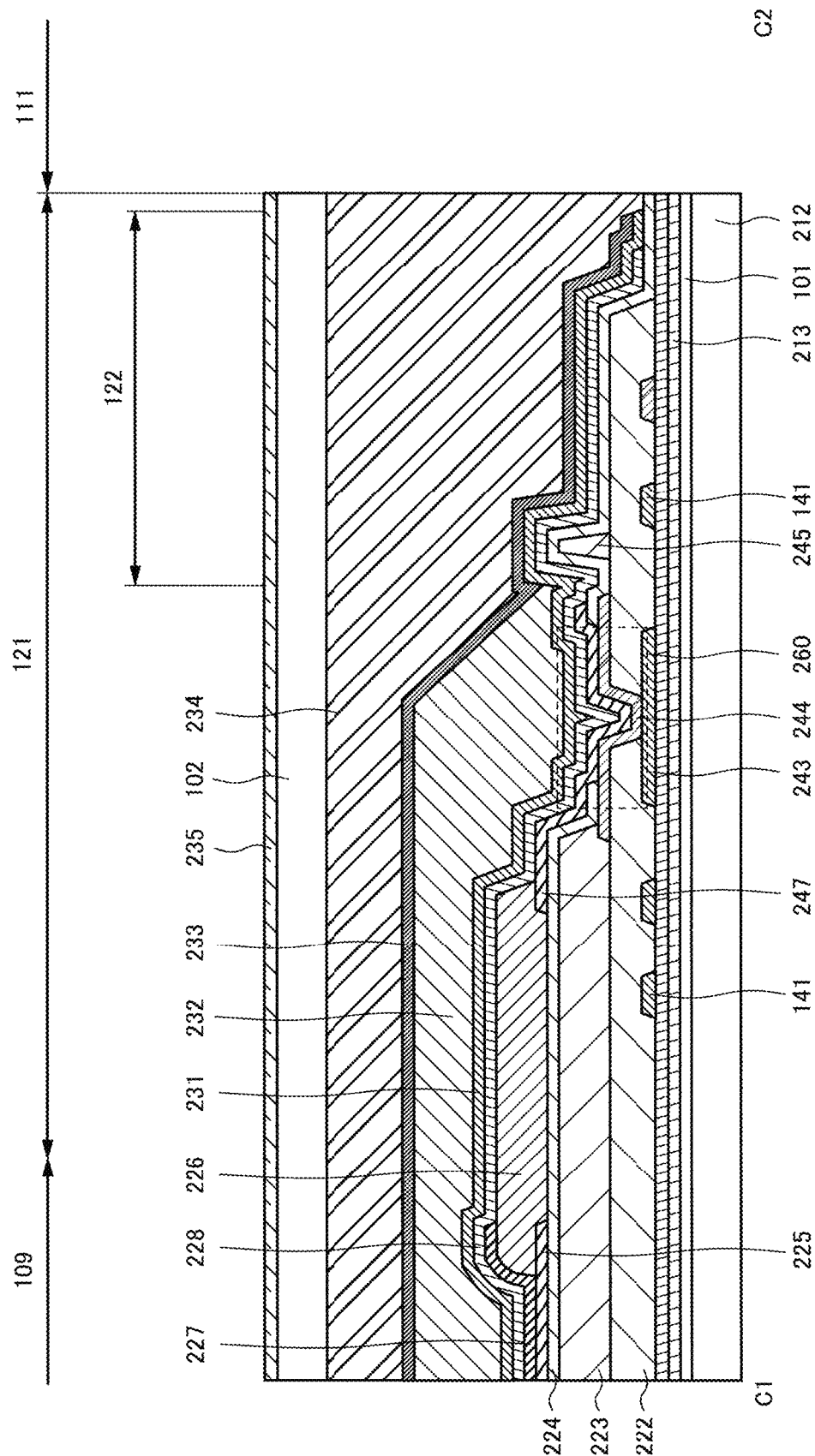
FIG. 8 is a cross-sectional view taken along line C1-C2 of the display region shown in FIG. 5.

FIG. 8 shows a cross-sectional view along C1-C2 line shown in FIG. 5. FIG. 8 is a cross-sectional view of the region 121 surrounding the through hole 111. In C1-C2 line shown in FIG. 8, the plurality of scanning lines 141 is traversed.

As shown in FIG. 8, in the region 121 surrounding the through hole 111, the conductive layer 243 and the plurality of scanning lines 141 are provided on the gate insulating film 215. Any of the plurality of scanning lines 141 may be provided below the sealing region 122 where the inorganic insulating layer 231 and the inorganic insulating layer 233 are in contact. The width t1 (see FIG. 4) of the region 121 surrounding the through hole 111 can be reduced by providing any of the scanning lines 141 under the sealing region 122.

Figure 9:
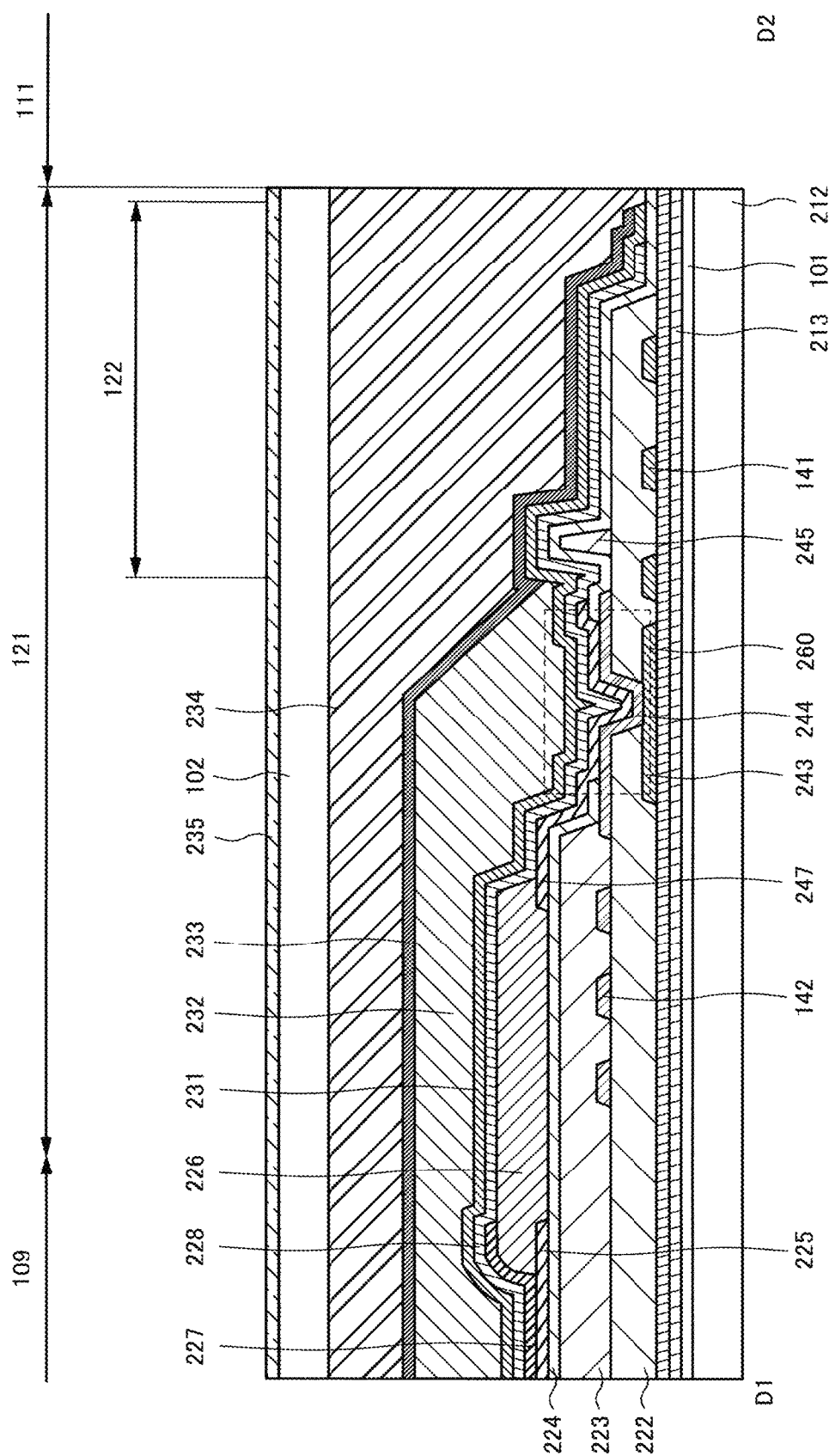
FIG. 9 is a cross-sectional view taken along line D1-D2 of the display region shown in FIG. 5.

FIG. 9 shows a cross-sectional view along D1-D2 line shown in FIG. 5. FIG. 9 is a cross-sectional view of the region 121 surrounding the through hole 111. D1-D2 line shown in FIG. 5 cross the plurality of scanning lines 141 and the plurality of signal lines 142.

As shown in FIG. 9, in the region 121 surrounding the through hole 111, the conductive layer 243 and the plurality of scanning lines 141 are provided on the gate insulating film 215. The plurality of scanning lines 141 is provided below the sealing region 122 in contact with the inorganic insulating layer 231 and the inorganic insulating layer 233. It is preferable that the scanning line 141 be provided below the sealing region 122 because the width t1 (see FIG. 4) of the region 121 surrounding the through hole 111 can be further reduced.

As described above, the sealing region 122 provided in contact with the inorganic insulating layer 231 and the inorganic insulating layer 233 is provided in the region 121 surrounding the through hole 111. As a result, moisture and oxygen can be prevented from entering from the edge of the opening of the through hole 111. As a result, the passage of moisture and oxygen can be blocked, and thus may decrease deterioration of the light emitting element 230. Therefore, the reliability of the display device 100 can be improved. Further, by providing the through hole 111 in the display region 103, the external design of the display device 100 can be improved.

Also, in the region 121 surrounding the through hole 111, by providing the cathode contact 260 between the pixel 109 and the sealing region 122, it is possible to suppress an increase in the resistivity of the common electrode 228 in the region 121 around the through hole 111.

In a cross-sectional view of the display device 100 shown in FIGS. 7 to 9, the configuration in which the cathode contact 260 is provided between the pixel 109 and the sealing region 122 in the region 121 around the through hole 111 is shown. The present invention is not limited thereto. The cathode contact 260 need not be provided so as to surround the through hole 111 but may be partially provided in the region 121.

Figure 10:
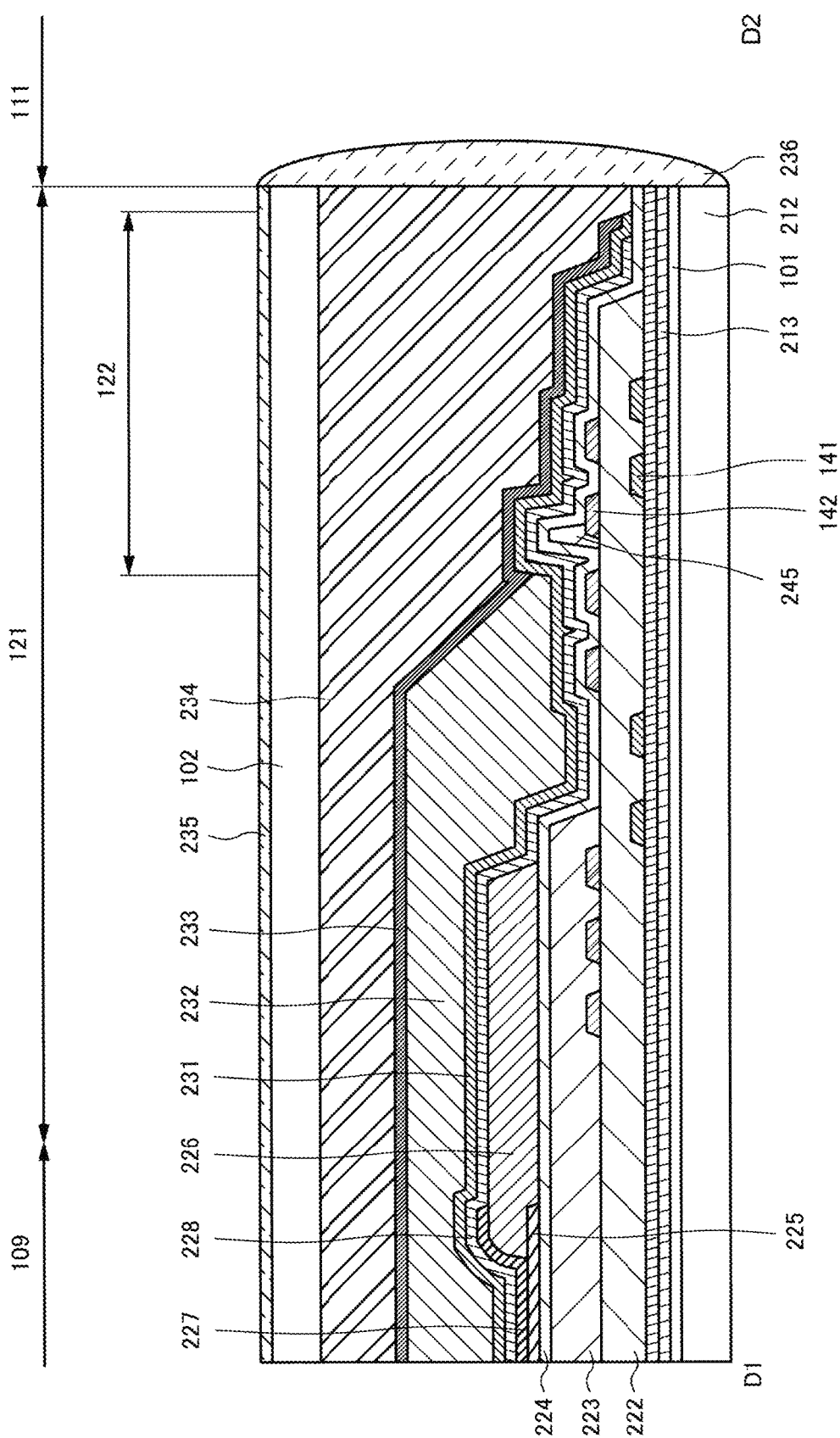
FIG. 10 is a cross-sectional view taken along line D1-D2 of the display region shown in FIG. 5.

FIG. 10 shows an example in which a cross-sectional view taken along the line D1-D2 shown in FIG. 5 which partially differs from a cross-sectional view shown in FIG. 9. FIG. 10 differs from FIG. 9 in that the plurality of scanning lines 141 and the plurality of the signal lines 142 are provided in the sealing region 122. FIG. 10 shows an embodiment in which the cathode contact 260 is not provided.

It is preferable to provide the plurality of scanning lines 141 and the plurality of signal line 142 below the sealing region 122 because the width t1 of the region 121 surrounding the through hole 111 can be made smaller. In FIG. 10, although the plurality of scanning lines 141 and the plurality of signal lines 142 are provided in the sealing region 122, the present invention is not limited thereto. It may be any of the plurality of scanning lines 141 or the plurality of signal lines 142. In addition, an insulating film 236 such as an organic resin or an inorganic film having moisture-proof properties and oxygen-proof properties may be provided on side of the through hole 111. This may further suppress the penetration of moisture and oxygen from side of the through hole 111. Also, in FIGS. 7 to 10, the insulating film 236 can be provided on side of the through hole 111.

An inorganic insulating material or an organic insulating material can be used as the insulating film 236. Usable as the inorganic insulating material may be silicate glass such as PSG (Phosphorus Silicon Glass) or BPSG (Boron Phosphorus Silicon Glass). Usable as the organic insulating material may be an acrylic resin or a styrenic resin, and for example, Taffy made by Hitachi Chemical Company, Ltd. is preferable. By providing the insulating film 236, when components such as cameras and buttons are passed through the through hole 111, damage can be prevented when side of the through hole 111 contacts the components.

Figure 11:
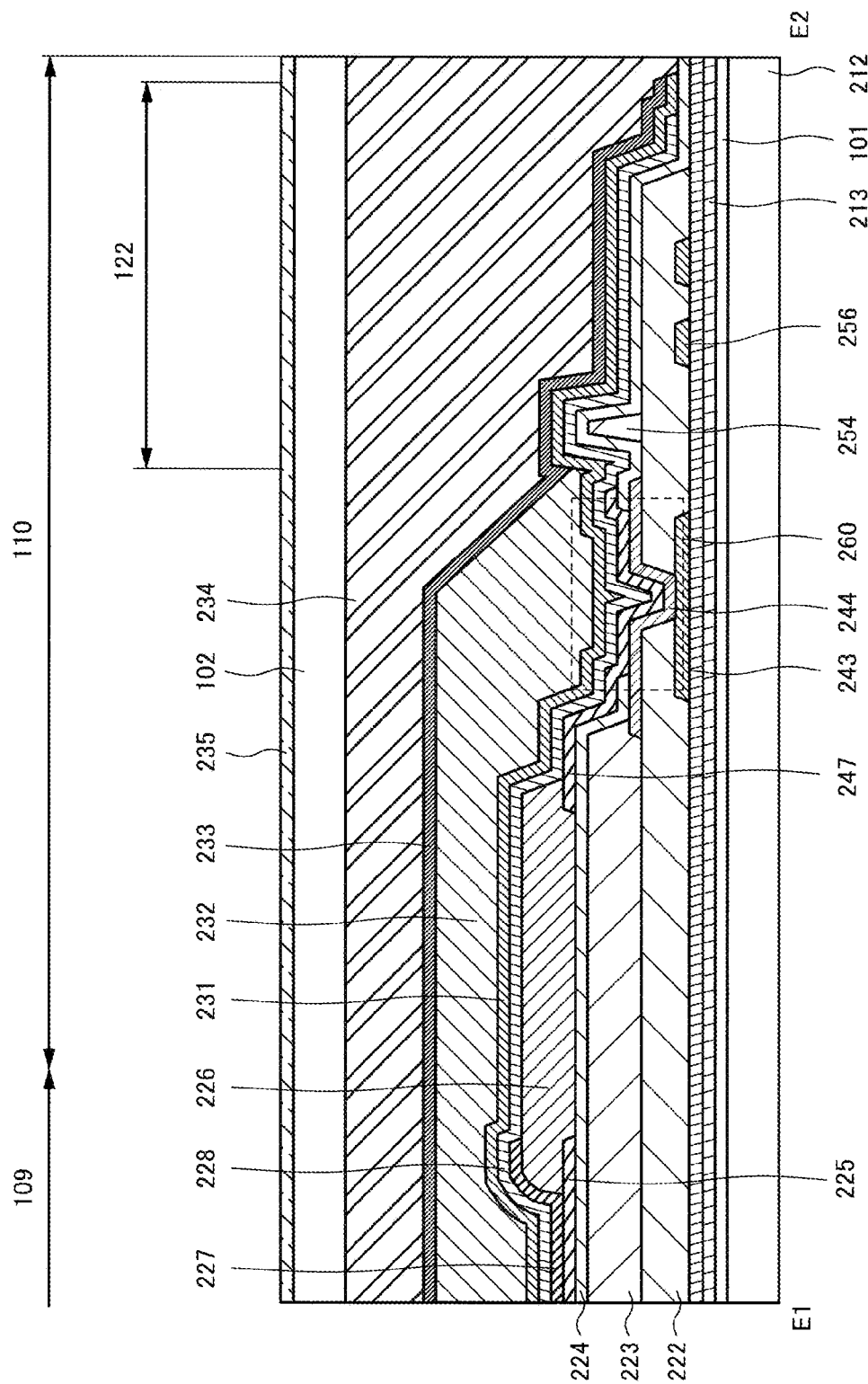
FIG. 11 is a cross-sectional view taken along line E1-E2 of the display region shown in FIG. 5.

FIG. 11 shows a cross-sectional view taken along line E1-E2 shown in FIG. 5. FIG. 11 is a cross-sectional view of the region 121 surrounding the through hole 111. In line E1-E2 shown in FIG. 11, a cross-sectional view of the peripheral region 110 from the pixel 109 and the pixel 109 to the end of the substrate 101 is shown.

As shown in FIG. 11, in the peripheral region 110, a plurality of wiring layer 256 is provided on the gate insulating film 215. For example, the plurality of wiring layer 256 may have a function of connecting the driving circuit 104 arranged on the left and right sides of the display region 103 in FIG. 1.

As shown in FIG. 11, the cathode contact 260 is provided in the peripheral region 110. In the sealing region 122, an end portion of a common electrode 288 is provided, and an end portion of the common electrode 288 is covered by the inorganic insulating layer 231 and the inorganic insulating layer 233. As a result, moisture and oxygen can be prevented from entering the display region 103 from the end of the common electrode 288.

<Region from the End of the Substrate to the Driving Circuit>

Next, referring to FIG. 12, the configuration of region from the end of the substrate 101 to the driving circuit 104 will be described.

Figure 12:
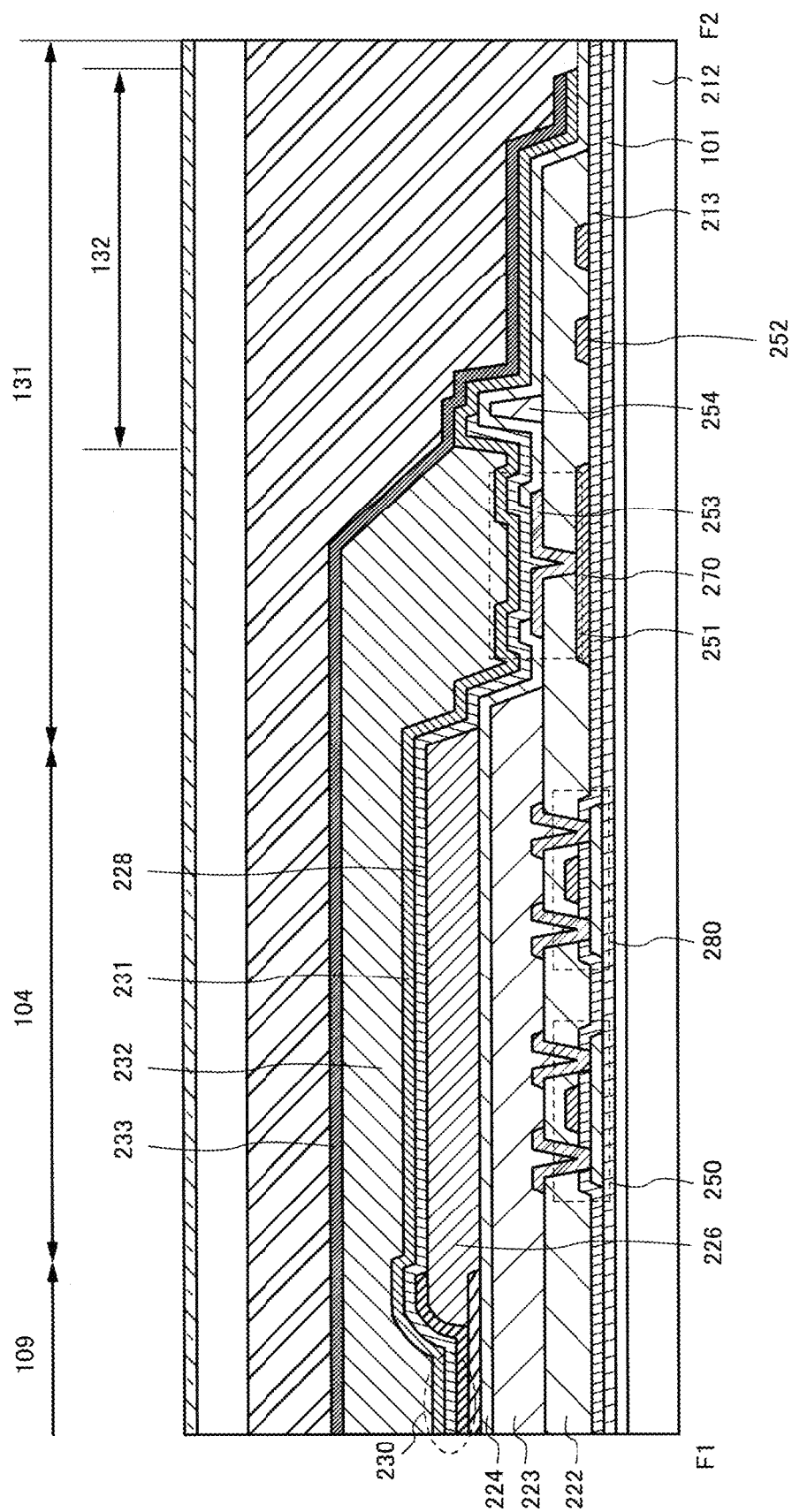
FIG. 12 is a cross-sectional view taken along line F1-F2 of the display region shown in FIG. 5.

FIG. 12 shows a cross-sectional view taken along line F1-F2 shown in FIG. 5. FIG. 12 shows a cross-sectional view of the driving circuit 104 and a region 131 from the driving circuit 104 to the end of the substrate 101.

As shown in FIG. 12, the driving circuit 104 includes a plurality of transistor 280 and a transistor 250 on the under film 213. The transistor 280 and the transistor 250 may be provided in the same configuration as the transistor 210 provided in the pixel 109. A conductive layer 251 and a wiring layer 252 are provided on the gate insulating film 215. The wiring layer 252 has, for example, a function of transmitting signals from the driver IC 106 to the driving circuit 104. The conductive layer 251 and the wiring layer 252 may be formed of the same conductive film as the scanning line 141.

The interlayer insulating film 222 is provided on the transistor 280 and the transistor 250. The planarization film 223 and a protruding portion 254 are provided on the interlayer insulating film 222. The protruding portion 254 and a protruding portion 255 are formed of the same materials as the planarization film 223.

The inorganic insulating layer 224 is provided on the planarization film 223. The inorganic insulating layer 224 is provided so as to cover the end of the planarization film 223, the protruding portion 254, and the protruding portion 255. By providing the inorganic insulating layer 224 so as to cover the protruding portion 254 and the protruding portion 255, hydrogen/oxygen can be prevented from entering from the end portion of the planarization film 223. As a result, the light-emitting element 230 of the pixel 109 can be prevented from being deteriorated by moisture and oxygen.

The insulating layer 226 is provided on the inorganic insulating layer 224. The common electrode 228 is provided on the insulating layer 226. The common electrode 228 is provided on the driving circuit 104 and is connected to a conductive layer 253 through the contact hole provided in the inorganic insulating layer 224. Thus, a region where the common electrode 228 and the conductive layer 253 are connected become a cathode contact 270. Although the cathode contact 270 is provided between the substrate 101 and the driving circuit 104, the contact 270 may be provided between the driving circuit 104 and the display region 103.

In a region between the end of the substrate 101 and the driving circuit 104, a sealing region 132 is provided so as to be in contact with the inorganic insulating layer 231 and the inorganic insulating layer 233. By the sealing region between the driving circuit 104 and the end of the substrate 101 with the inorganic insulating layer 231 and the inorganic insulating layer 233, moisture and oxygen can be prevented from entering from the end of the substrate 101. As a result, the entry path of moisture and oxygen can be blocked, so that the degradation of the light-emitting element can be suppressed. Therefore, the reliability of display device can be improved.

Also, in the sealing region 132, by providing the wiring layer 252 for driving the driving circuit 104, the width t2 from the end of the substrate 101 to the driving circuit 104 can be reduced.

Although an example in which the width t1 is larger than the width t2 in the widths t1 and t2 in FIG. 4 has been described, the present invention is not limited thereto. The width t2 may be larger than the width t1. The width of the region 121 surrounding the through hole 111 shown in the cross-sectional view of FIGS. 7 to 9 may be larger than the width t1. In the region 121 surrounding the through hole 111 shown in the cross-sectional view of FIG. 10, the width t1 can be further reduced because the cathode contact 260 is not provided. In this manner, by not providing the cathode contact 260, the width t2 may be made larger than the width t1.

As shown in the cross-sectional view of FIG. 10, even when the cathode contact 260 is not provided around the through hole 111, as shown in FIG. 11, by providing the cathode contact 270 in the peripheral region 110, the resistance value of the cathode can be sufficiently reduced. Further, when the width t1 is reduced, the pixel 109 can be arranged close to the through hole 111, and thus the appearance of the display device is improved.

<Manufacturing Method of the Display Device>

Figure 13:
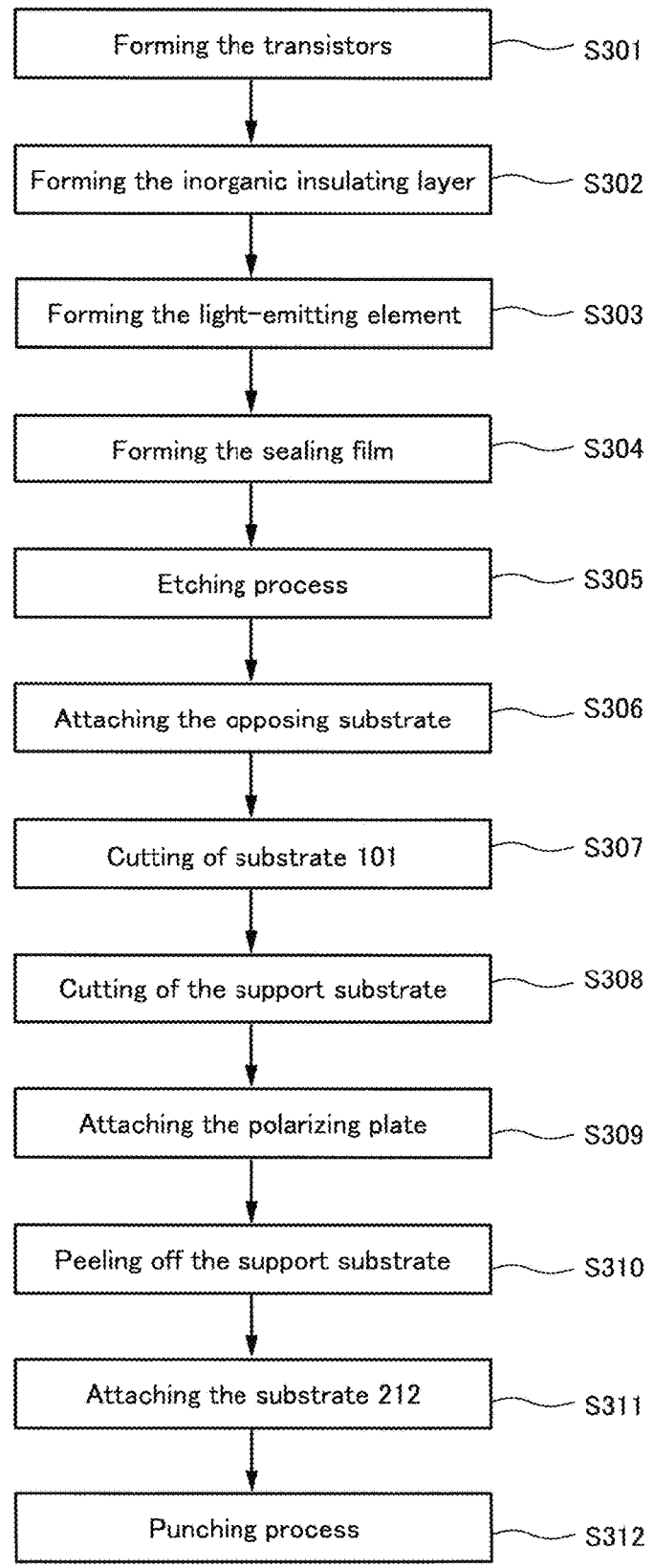
FIG. 13 is a method for producing the display device according to one embodiment of the present invention.

Next, referring to FIGS. 13 to 15B, a manufacturing method of the display device 100 will be described. FIG. 13 is a process flow for explaining the manufacturing process of the display device 100 according to this embodiment. FIGS. 14A to 15B are planar view of masks for manufacturing the display device 100. In the process flow shown in FIG. 13, the description of the pixel 109 will be described with reference to the reference numerals in FIG. 6, and the through hole 111 and the region 121 surrounding the through hole 111 will be described with reference to the reference numeral in FIG. 7.

First, the transistor 210 is formed on the substrate 101 formed on a support substrate (not shown) (step S301). In this embodiment, the glass substrate is used as the support substrate, and polyimide is used as the substrate 101. The gate electrode 216, the scanning line 141, and the conductive layer 243 of the transistor 210 are formed from the same conductive film. Next, on the transistor 210, the interlayer insulating film 222 and the source or drain electrodes 217 and 218 to be connected via a contact hole of the interlayer insulating film 222 are formed. The source or drain electrode 217, the signal line 142, and the conductive layer 244 are formed of the same conductive film. Next, the planarization film 223 is formed on the interlayer insulating film 222 and the source or drain electrode 218. The planarization film 223 is processed so that the protruding portion 245 is formed in the region 121. The contact hole is formed in the planarization film 223.

In the display region 103, the transparent conductive layer 219 is formed in the contact hole of the planarization film 223. Next, the conductive layer 221 is formed on the planarization film 223.

Next, the inorganic insulating layer 224 is formed on the planarization film 223, the transparent conductive layer 219, the conductive layer 221, and the protruding portion 245 (step S302). The inorganic insulating layer 224 is formed so as to cover the end of the planarization film 223 present in the region 121 and the protruding portion 245.

Next, the light-emitting element 230 is formed on the inorganic insulating layer 224 (step S303). The light-emitting element 230 is configured by sequentially forming the pixel electrode 225, the insulating layer 226, the organic layer 227, and the common electrode 228.

Figure 14A:
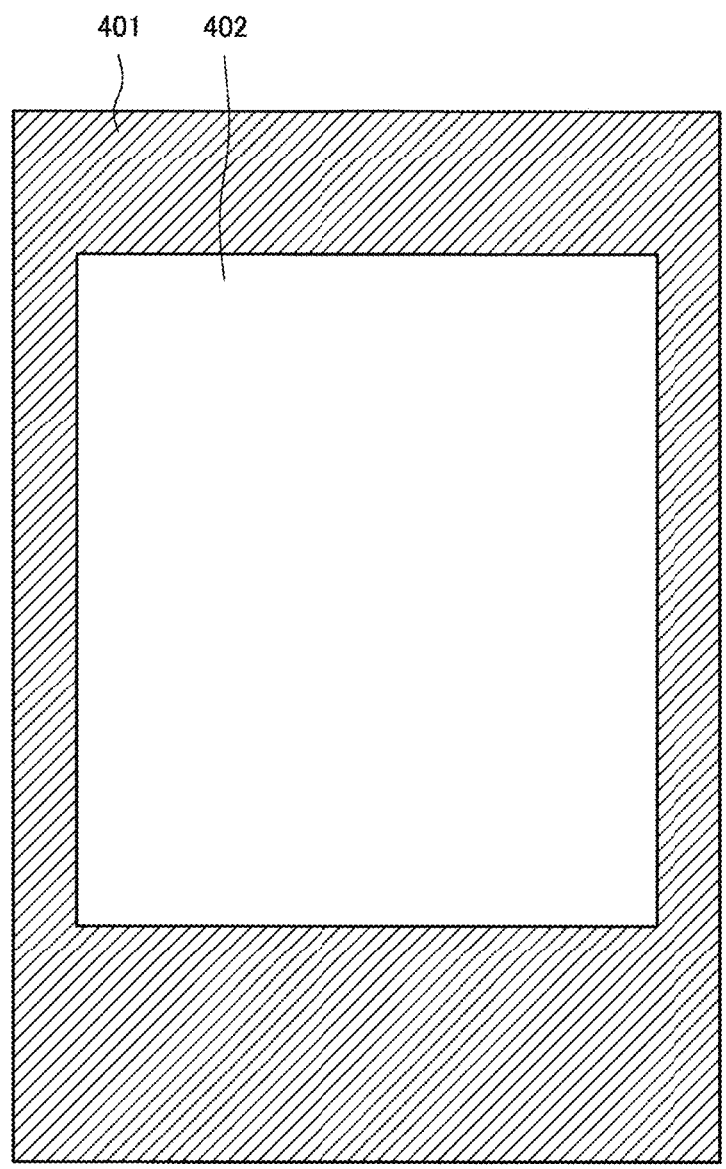
FIG. 14A is a planar view of a mask for the method for producing the display device according to one embodiment of the present invention.
Figure 14B:
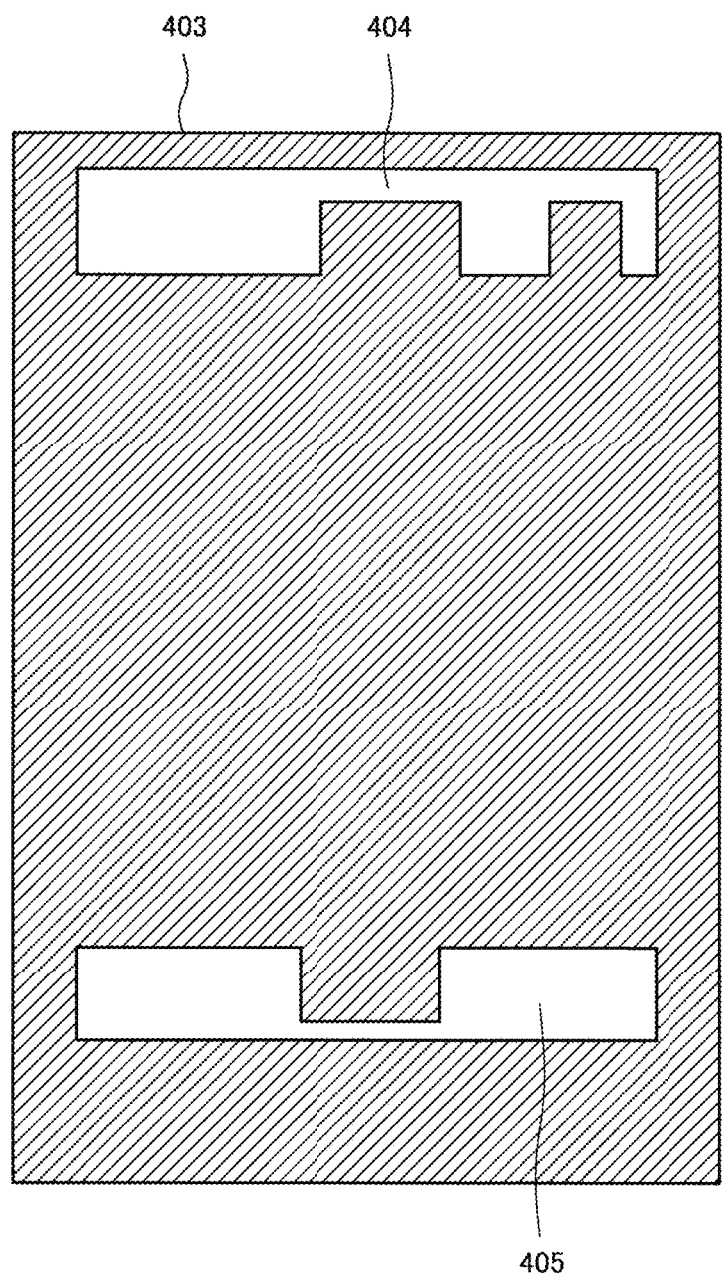
FIG. 14B is a planar view of a mask for the method for producing the display device according to one embodiment of the present invention.

In forming the light-emitting element 230, for example, a mask 401 shown in FIG. 14A and a mask 403 shown in FIG. 14B can be used. The mask shown in FIGS. 14A and 14B is, for example, an evaporation mask used for the hole injection layer/hole transport layer included in the organic layer 227, the electron injection layer/electron transport layer, and the common electrode 228.

For example, when forming the common electrode 228, a portion of the common electrode 228 is deposited on an opening 402 by using the mask 401 shown in FIG. 14A. By using the mask 403 shown in FIG. 14B, part of the common electrode 228 is deposited in openings 404 and 405. By using the mask 401 and the mask 403, the common electrode 228 provided with the opening can be formed in the region corresponding to the through holes 111, 112, 113 in the display region 103.

Figure 15A:
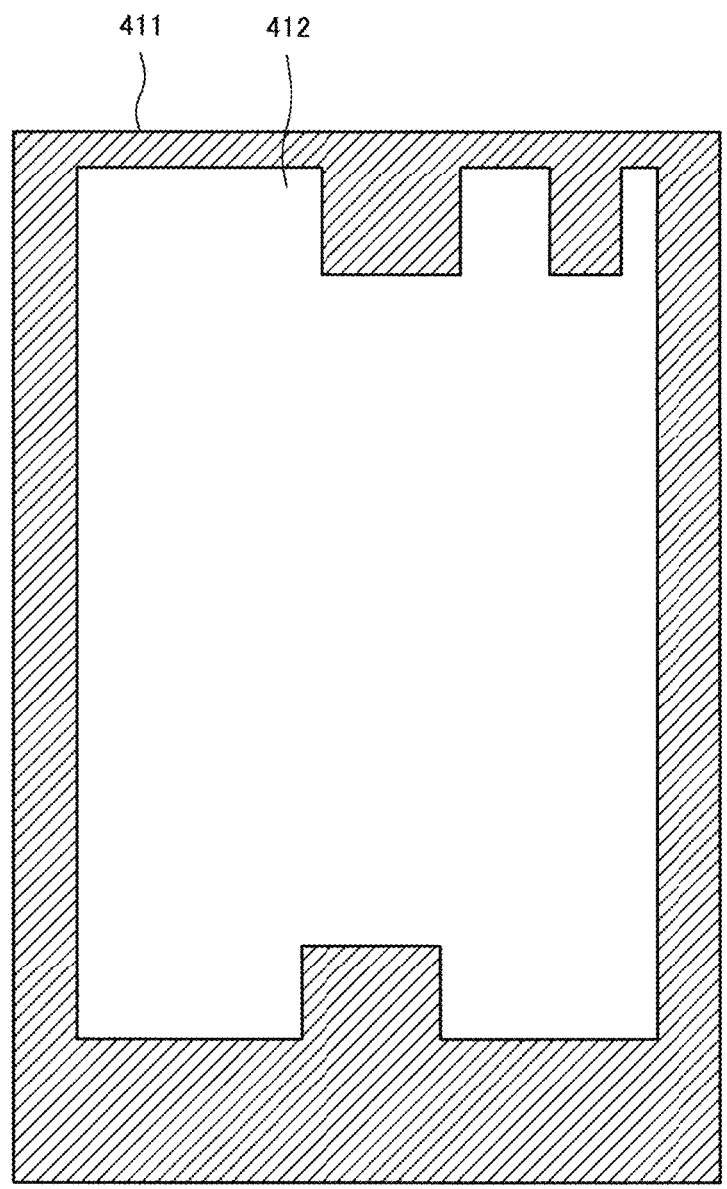
FIG. 15A is a planar view of a mask for the method for producing the display device according to one embodiment of the present invention.
Figure 15B:
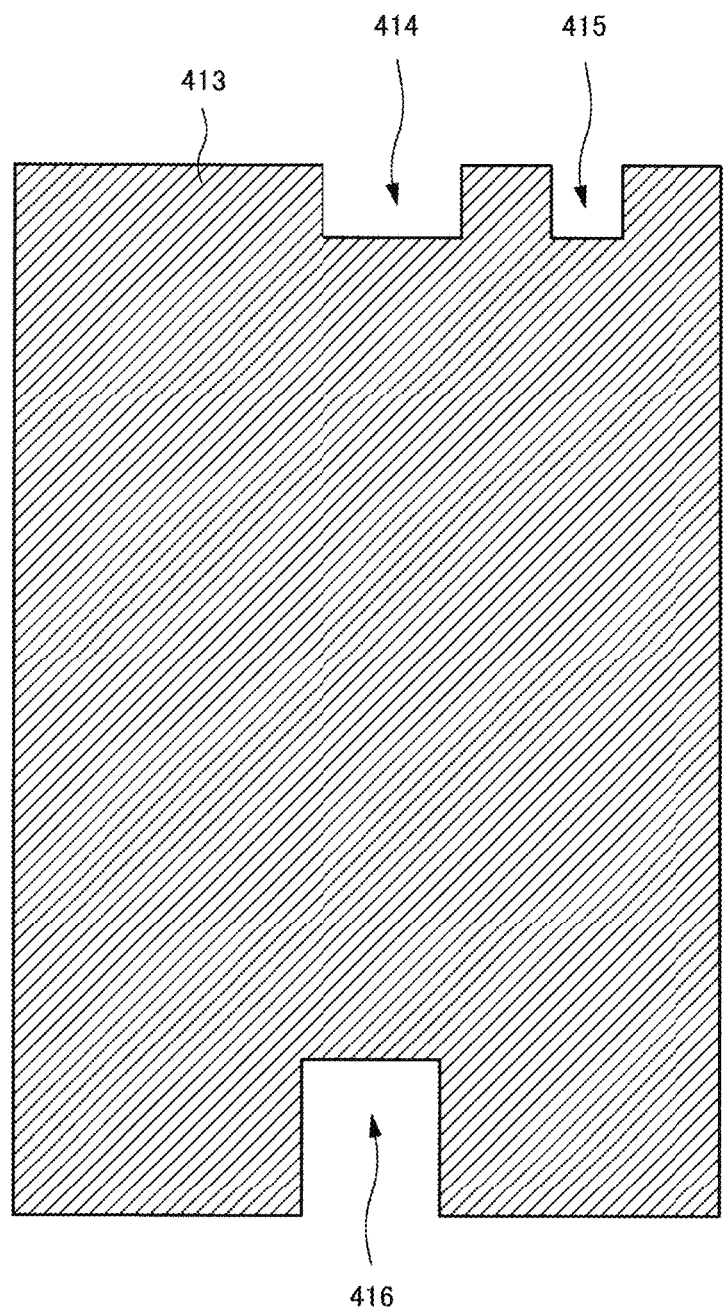
FIG. 15B is a planar view of a mask for the method for producing the display device according to one embodiment of the present invention.

As another form of the mask, a mask 411 shown in FIG. 15A and a mask 413 shown in FIG. 15B can be used. Using the mask 411 shown in FIG. 15A, a portion of the common electrode 228 is deposited on an opening 412. Next, by using the mask 413 shown in FIG. 15B, a part of the common electrode 228 is vapor-deposited in notches 414, 415, and 416. By using the mask 411 and the mask 413, the common electrode 228 provided with the opening can be formed in the region corresponding to the through holes 111, 112, 113 in the display region 103.

Next, a sealing film is formed on the light-emitting element 230 (step S304). As the sealing film, the inorganic insulating layer 231, the organic insulating layer 232, and the inorganic insulating layer 233 are formed in this order. At this time, in the region 121, the inorganic insulating layer 233 is provided so as to be in contact with the inorganic insulating layer 231 from the protruding portion 245 to the edge of the opening of the through hole 111. In the region 131, the protruding portion 245 to the end of the substrate 101 are provided so as to be in contact with the inorganic insulating layer 231 and the inorganic insulating layer 233.

Through the above steps, the array substrate 140 can be formed.

Next, a region on which the through hole 111 is to be formed is etched until the support substrate is exposed, that is, until the substrate 101 is in direct contact with the support substrate (step S305). The etching treatment may be dry etching or wet etching. The step S305 may be a step of etching up to the inorganic insulating layer 231. In addition, the step S305 may be omitted, and the mask may be used when forming the sealing film, so that the sealing film may not be formed in the region where the through hole 111 is formed.

Next, the substrate 101 on which the transistor 210 and the light-emitting element 230 are formed and the substrate 102 are attached to each other via the adhesive member 234 (step S306).

The laminated the substrate 101 and the substrate 102 are cut according to the shape of the display device 100 or in a size larger than the shape of the display device 100 (step S307). As the cutting method in step S307, a scribe-break using a scribing wheel, punching cutting, laser cutting, or a method combining these can be used.

Next, the support substrate is cut (step S308). As a method for cutting the supporting substrate, a scribe-break using a scribing wheel, punching cutting, laser cutting, and a combination thereof can be used. The step S307 and the step S308 may be performed simultaneously.

Next, the polarization plate 235 is attached to the substrate 102 (step S309). Thereafter, a step of mounting the driver IC 106 on the substrate 101 may be included.

Next, the substrate 101 is peeled off from the support substrate by irradiating the substrate 101 with a laser beam through the support substrate (step S310). The order of step S310 and step S309 may be reversed. A polarization plate 138 may be bonded after the support substrate is peeled off.

Next, the substrate 212 is attached to the back surface of the substrate 101 (step S311). In this embodiment, a case where polyethylene terephthalate is used as the substrate 212 will be described. Here, the configuration from the substrate 212 to the sealing film is referred to as the array substrate 140. Thereafter, when cutting is cut in a size larger than the shape of the display device in the step S307, the periphery of the array substrate 140 and the substrate 102 is cut in order to adjust the outer shape of the display device.

Next, the through hole 111 is formed in the array substrate 140, the substrate 212, and the substrate 102 (step S312). The through hole 111 is formed by a mechanical processing method such as punching or the like. The through hole 111 is formed so as to be located inside the region 121. As a result, the through hole 111 can be collectively formed in the array substrate 140, the substrate 212, and the substrate 102 on time.

Through the above steps, the display device 100 according to this embodiment can be formed. According to the manufacturing process shown in FIG. 13, the through hole 111 is provided in the display region 103, and a display device having improved design can be manufactured. In addition, even if the through hole 111 is formed, by providing the sealing region 122 in the region 121, it is possible to prevent moisture and oxygen from entering from the through hole 111, and thus it is possible to prevent the light-emitting element from deteriorating. Therefore, the reliability of display device can be improved.

In step S305, the inorganic insulating layer 231 and the inorganic insulating layer 233 may be previously removed in a region where the through hole 111 is provided. Thus, in the drilling step in step S312, it is possible to prevent the occurrence of cracks in the substrate 101, the inorganic insulating layer 231 and the inorganic insulating layer 233 due to the impact when the through hole 111 is formed. As a result, moisture, oxygen, and the like can be prevented from entering the light-emitting element 230 from cracks generated in the substrate 101, the inorganic insulating layer 231, and the inorganic insulating layer 233. As a result, a highly reliable display device 100 can be provided.

Second Embodiment

Figure 16:
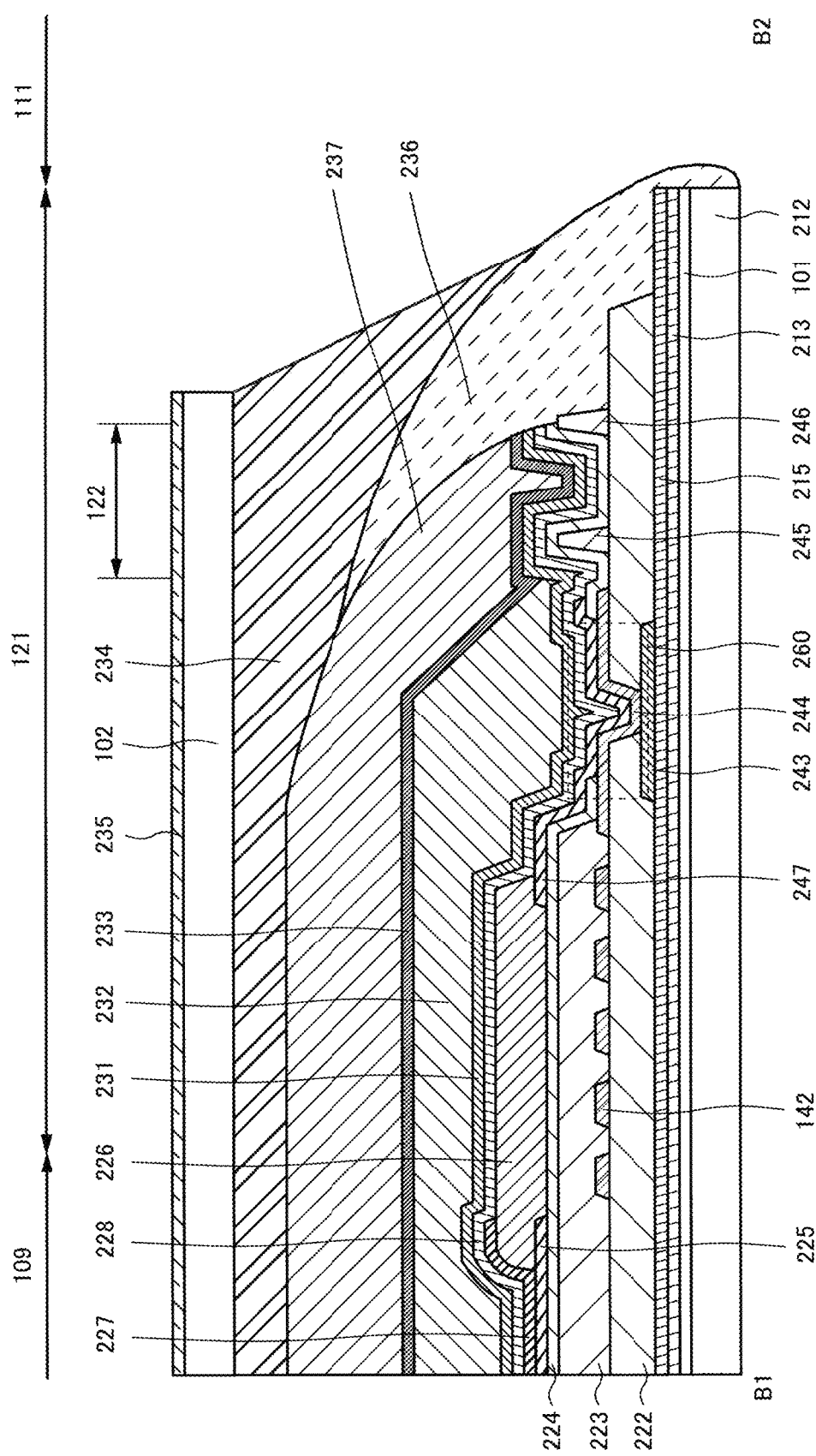
FIG. 16 is a cross-sectional view taken along line B1-B2 of the display region shown in FIG. 5.
Figure 17:
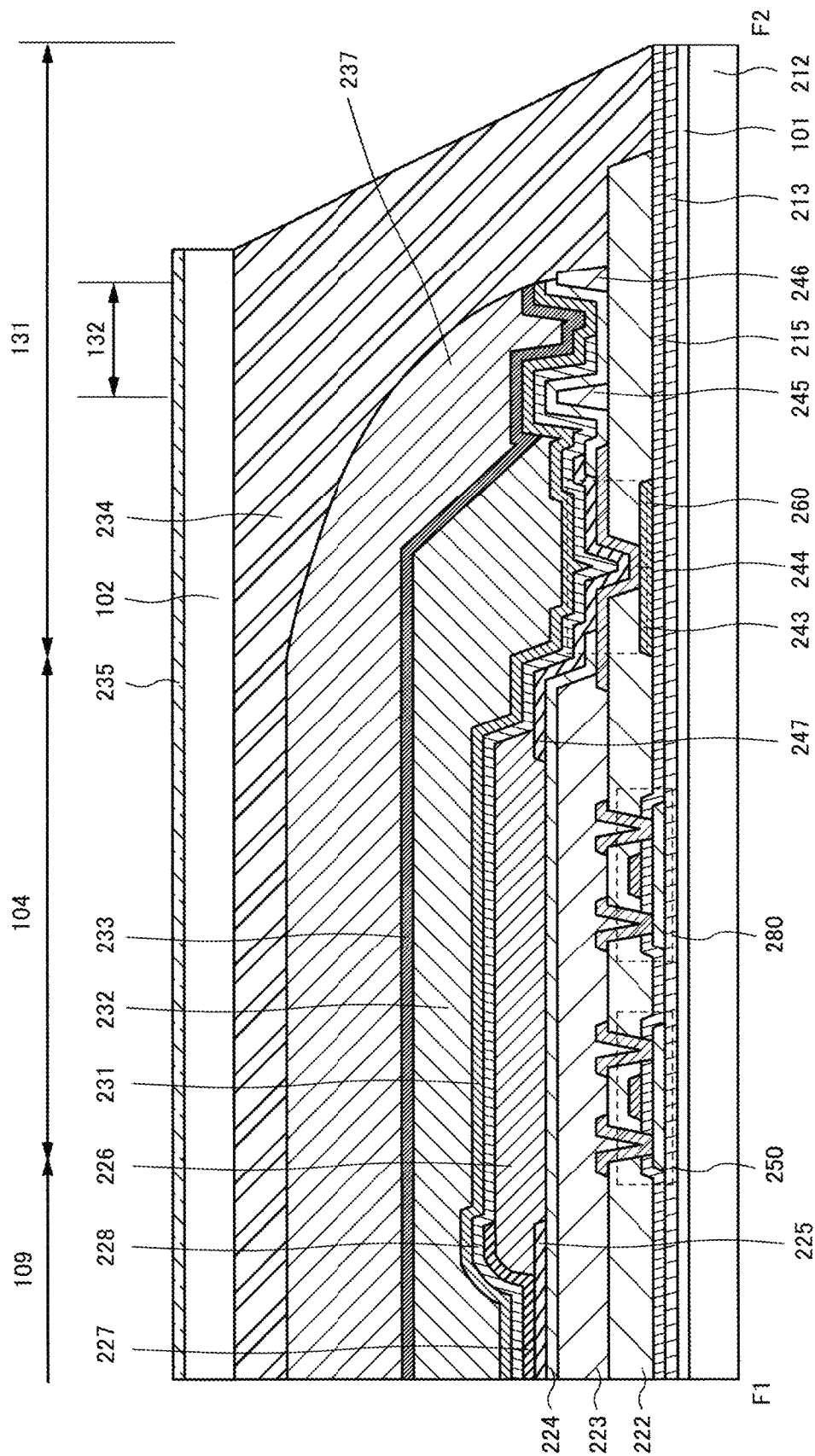
FIG. 17 is a cross-sectional view taken along line F1-F2 of the display device region shown in FIG. 5.
Figure 18:
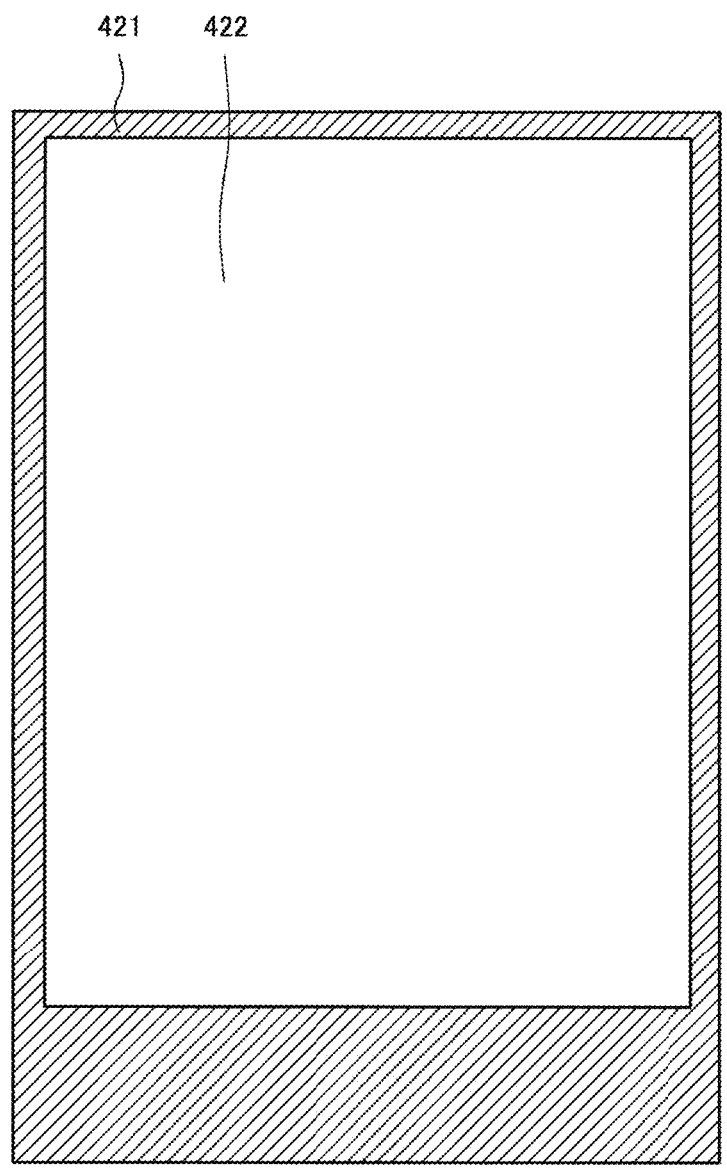
FIG. 18 is a planar view of a mask for the method for producing the display device according to one embodiment of the present invention.

In this embodiment, a partially different display device from the display device shown in the first embodiment will be described with reference to FIGS. 16 to 18. FIG. 16 is a cross-sectional view taken along line B1-B2 of the display region shown in FIG. 5. FIG. 17 is a cross-sectional view taken along line F1-F2 of the display region shown in FIG. 5. FIG. 18 is a planar view of the mask for manufacturing the display device.

FIG. 16 is a cross-sectional view of the pixel 109, the region 121 from the pixel 109 to the substrate 101, and the through hole 111. As shown in FIG. 16, a resin film 237 is provided on the inorganic insulating layer 233. The resin film 237 covers the pixel 109 and the cathode contact 260.

FIG. 17 is a cross-sectional view of the region 121 from the pixel 109, the driving circuit 104, and the driving circuit 104 to the substrate 101. Similar to FIG. 16, the resin film 237 is provided on the inorganic insulating layer 233. The resin film 237 covers the pixel 109, the driving circuit 104, and the cathode contact 260.

The resin film 237 shown in FIGS. 16 and 17 contains a resin such as an epoxy resin or an acrylic resin. The resin film 237 is formed by applying oligomers as raw materials by a wet film forming method, an evaporation method, a spraying method, or the like, and then polymerizing the oligomers.

The resin film 237 shown in FIGS. 16 and 17 functions as the mask for patterning the inorganic insulating layer 224, the common electrode 288, the inorganic insulating layer 231, and the inorganic insulating layer 233. By removing the inorganic insulating layer 224, the common electrode 288, the inorganic insulating layer 231, and the inorganic insulating layer 233 using the resin film 237 as a mask, the interlayer insulating film 222 and the gate insulating film 215 are exposed.

The insulating film 236 shown in FIG. 16 is provided over side of the substrate 101 from the end of the resin film 237. At this time, the insulating film 236 is provided to cover side of the inorganic insulating layer 224, the common electrode 288, the inorganic insulating layer 231, and the inorganic insulating layer 233. Since the insulating film 236 is moisture-proof and oxygen-proof, the insulating film 236 can suppress moisture and oxygen from entering the display region 103 from side of the inorganic insulating layer 224, the common electrode 288, the inorganic insulating layer 231, and the inorganic insulating layer 233. Further, the insulating film 236 covers the side surface of the substrate 101. Therefore, when a component such as a camera or a button is passed through the through hole 111 and the side surface of the through hole 111 comes into contact with the component, damage to the through hole 111 can be prevented.

In forming the common electrode 288, for example, a mask 421 shown in FIG. 18 can be used. The mask 421 has an opening 422 that overlaps all of the display region 103 and a portion of the peripheral region 110. In forming the common electrode 288, the common electrode 288 is deposited on the opening 422 using the mask 421 shown in FIG. 18. Thus, the common electrode 288 is also formed in each of the through holes 111, 112, 113.

Thereafter, the resin film 237 is formed on the inorganic insulating layer 233 and etched using the resin film 237 as the mask, whereby the inorganic insulating layer 233, the organic insulating layer 232, and the inorganic insulating layer 231 can be removed. The common electrode 288 formed around the through holes 111, 112, 113 is etched away. Even if the end of the common electrode 288 is exposed together with the inorganic insulating layer 231 and the inorganic insulating layer 233, the end of the common electrode 288, the end of the inorganic insulating layer 231, and the end of the inorganic insulating layer 233 can be covered with a moisture-proof and oxygen-proof the insulating film 236. As a result, moisture and oxygen can be prevented from entering the display region 103 from the end of the common electrode 288.

Third Embodiment

Figure 19:
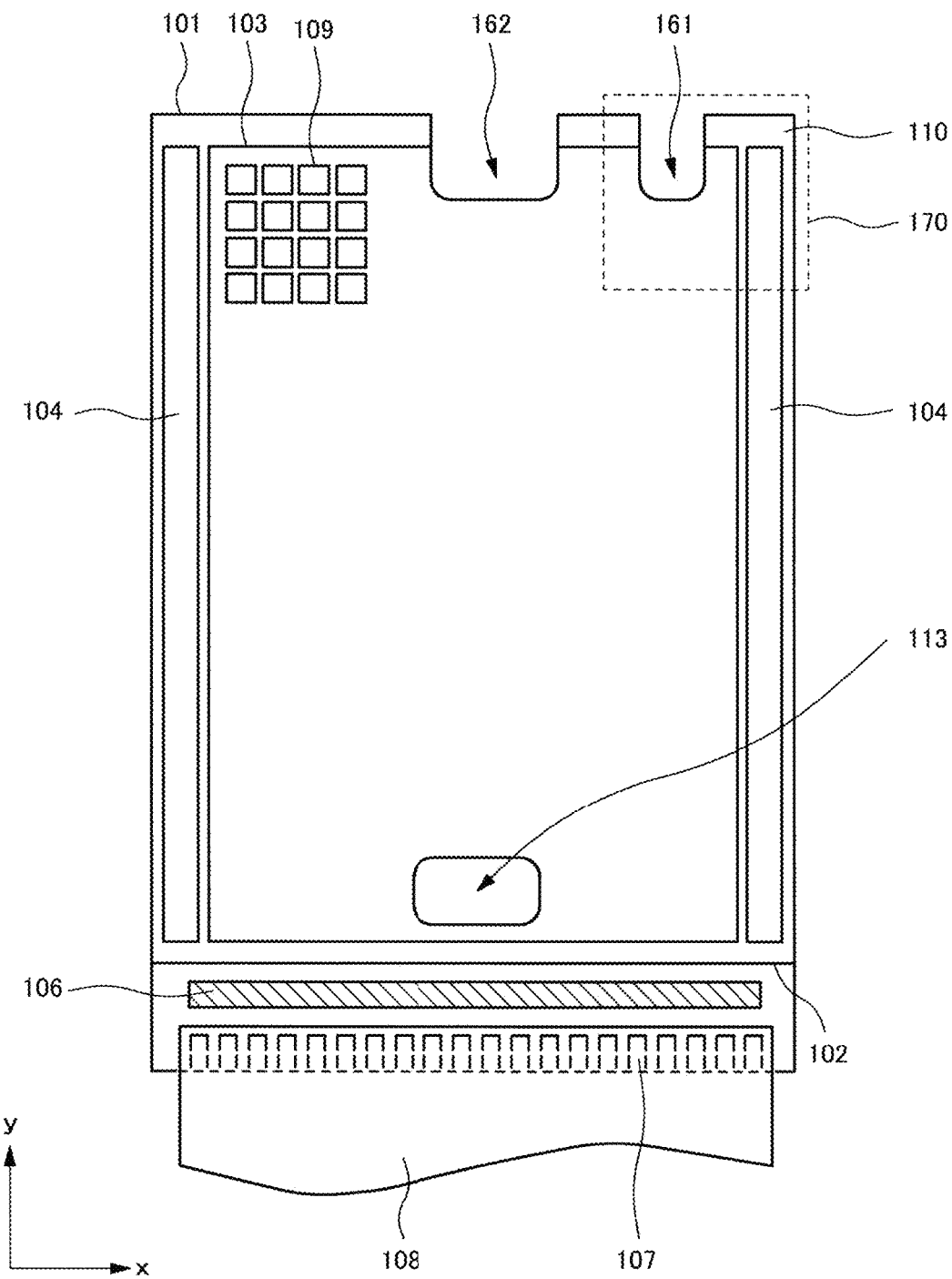
FIG. 19 is a schematic view showing the configuration of the display device according to one embodiment of the present invention.

FIG. 19 is a schematic view showing the configuration of a display device 160 according to an embodiment of the present invention, shows a schematic configuration when the display device 160 is planar view. The same elements as those of the first embodiment are denoted by the same reference numerals, and a detailed description thereof is omitted.

The display device 160 according to this embodiment includes at least one notch 161 in the display region 103. In FIG. 19, the notch 161 and a notch 162 are provided at two positions of the display device 160, and a the through hole 111 is provided at one position. In the notch 161 and the notch 162, the substrate 101, the display region 103, and the substrate 102 are also cut out.

Figure 20:
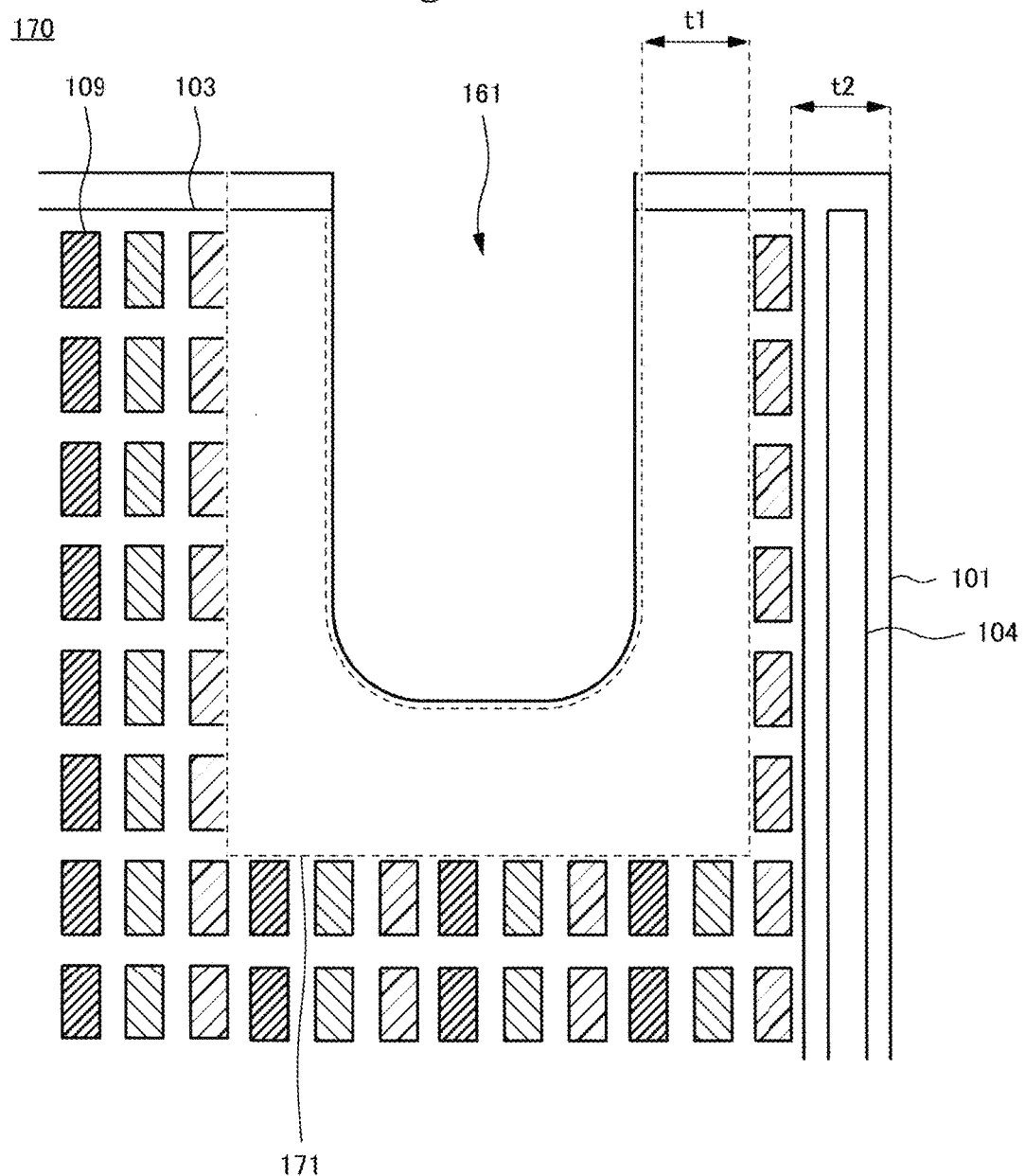
FIG. 20 is an enlarged view of a part of the display device shown in FIG. 19.

FIG. 20 shows an enlarged view of a region 170 shown in FIG. 19. The region 170 includes the display area 103, the driving circuit 104, the notch 161, and a region 171 surrounding the notch 161. The region 171 surrounding the notch 161 refers to a region surrounded by the plurality of pixels 109 from the edge of the notch 161. In the display region 103, the plurality of pixels 109 is arranged in a matrix.

Figure 21:
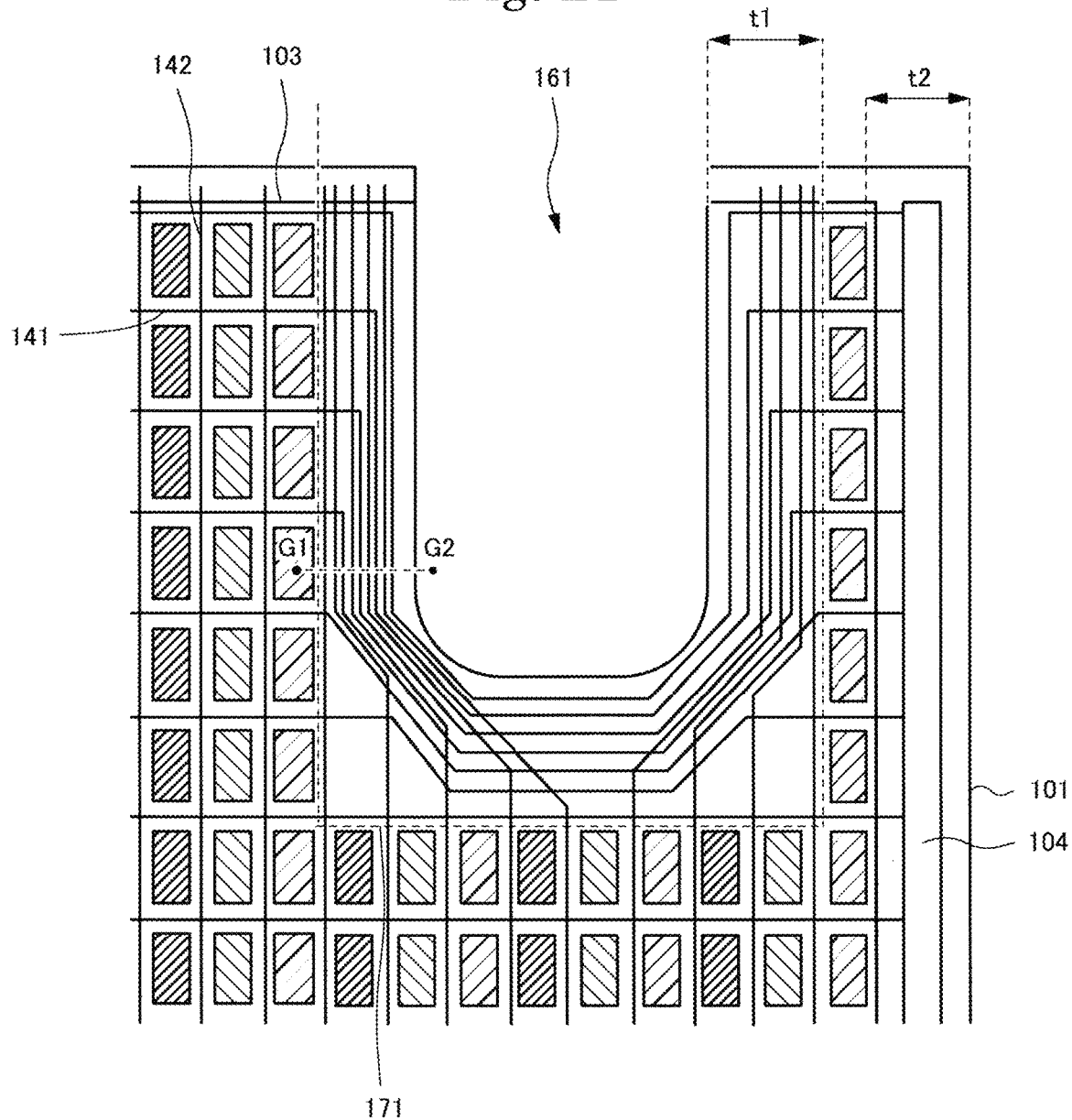
FIG. 21 is an enlarged view of a part of the display device shown in FIG. 19.

FIG. 21 is an enlarged view of the region 170 shown in FIG. 19, in which the plurality of scanning lines 141 and the plurality of signal lines 142 are added. The plurality of scanning lines 141 is electrically connected to the pixel 109, and the plurality of signal lines 142 is electrically connected to the pixel 109.

As shown in FIG. 21, in the region 171 surrounding the notch 161, the plurality of scanning lines 141 is connected to the right and left pixels 109 with respect to the notch 161 by bypassing the notch 161. The plurality of signal lines 142 is routed to the peripheral region 110 by bypassing the notch 161. The plurality of signal lines 142 may have the end portion in the region 171 surrounding the notch 161.

As shown in FIG. 21, the width t1 of the region 121 in the second direction (in the x-direction in FIG. 19) is larger than the width t2 from the end of the substrate 101 to the end of the driving circuit 104 in first direction. Depends on the area of the notch 161, in the region 171 surrounding the notch 161, while several tens to hundreds of wirings are provided to bypass the cutout 161, several to ten wirings are provided in the width from the end of the substrate 101 to the end of the drive circuit 104.

<The Region Surrounding the Notch>

Figure 22:
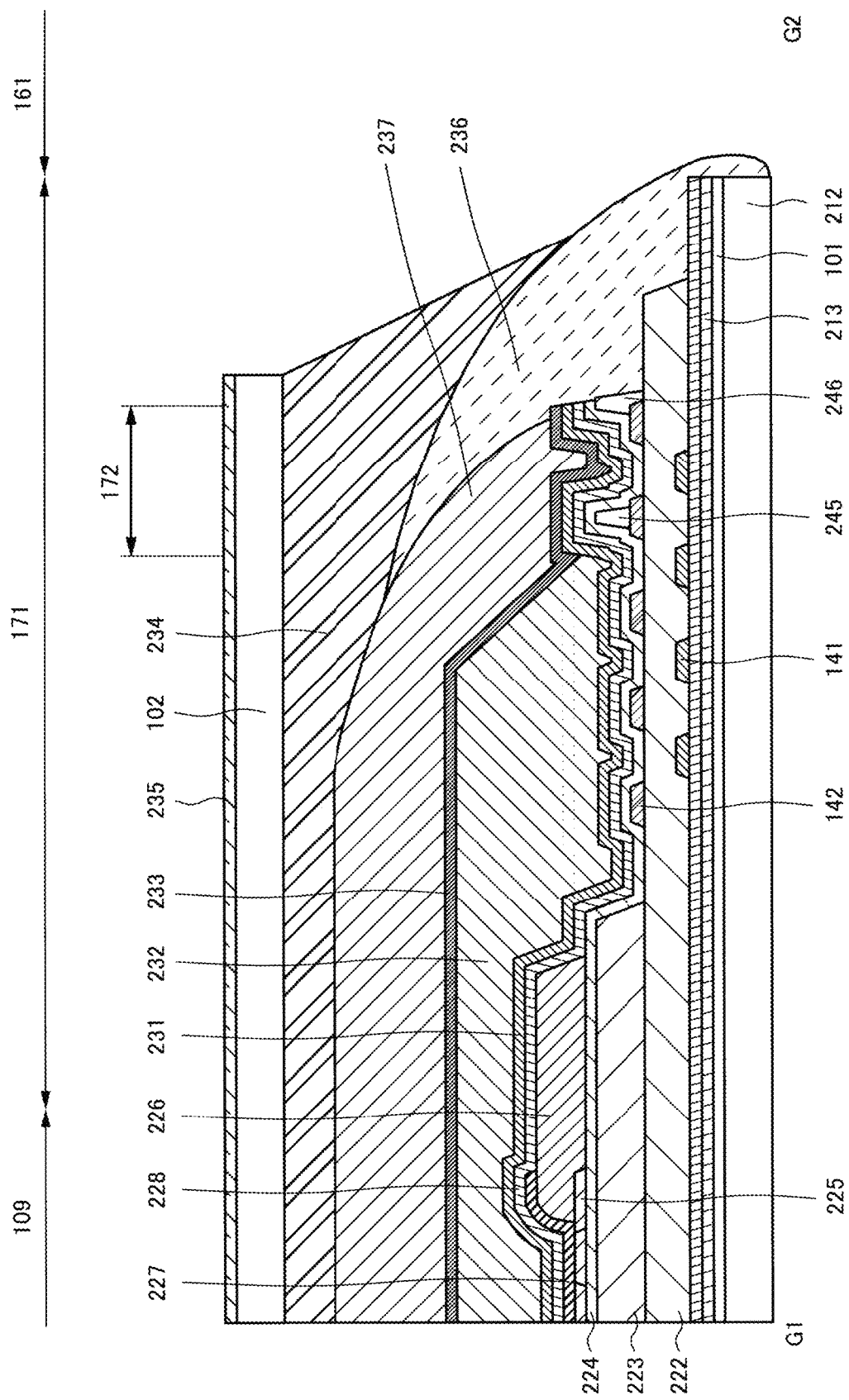
FIG. 22 is a cross-sectional view taken along line G1-G2 of the display region shown in FIG. 21.

FIG. 22 is a cross-sectional view taken along line G1-G2 of the display region shown in FIG. 21. FIG. 22 is a cross-sectional view of the region 171 surrounding the notch 161. FIG. 22 shows a cross-sectional view of the pixel 109, the region 171 surrounding notch, and the notch 161.

As shown in FIG. 22, in a region surrounding the notch 161, the plurality of scanning lines 141 is provided on the gate insulating film 215. The interlayer insulating film 222 is provided over the gate insulating film 215, and the plurality of signal lines 142 are provided over the interlayer insulating film 222. The planarization film 223 is provided on the interlayer insulating film 222. The protruding portions 245 and 246 projecting in the direction toward the inorganic insulating layer 231 are provided so as to partially overlap the signal lines 142. The inorganic insulating layer 233 is provided so as to be in contact with the inorganic insulating layer 231 from the protruding portion 245 to the edge of the opening of the notch 161. A region where the inorganic insulating layer 231 and the inorganic insulating layer 233 are in contact with each other is called a sealing region 172. In addition, the protruding portion 245 has a function of damming the organic insulating layer 232 when forming the organic insulating layer 232. Therefore, the organic insulating layer 232 does not overlap with the protruding portion 245.

As shown in FIG. 22, the plurality of signal lines 142 may be provided partially overlapping with the sealing region 172. In addition, the plurality of scanning lines 141 may be provided so as to partially overlap with the sealing region 172. This is preferable because the width t1 (see FIG. 20) of the region 171 surrounding the notch 161 can be made smaller. The sealing region 172 and the signal line 142 do not necessarily have to overlap with each other, and the signal line 142 may be provided closer to the pixel 109 than the sealing region 172. Further, in the region 171, the signal line 142 does not have to be extended because there is no pixel 109 connected to the region 171. However, in order to prevent loads from differing between the signal line 142 extending to the outer display region of the region 171 and the signal line 142 in the region 171, it is preferable that the signal line 142 extends as in this embodiment.

Further, although an example in which the cathode contact is not provided in the region 171 shown in FIG. 22 is shown, the present invention is not limited to this. The cathode contact 260 shown in FIGS. 7 to 9 may be provided between the pixel 109 and the sealing region 172 in the region 171. Also provided in the sealing region 172 near the opening edge of the notch 161 is the end of the common electrode 228. Side of the notch 161 may be provided with the insulating film 236 such as an organic resin or an inorganic film having moisture-proof properties and oxygen-proof properties. This makes it possible to further suppress the penetration of moisture and oxygen from the side of the notch 161. By covering the end of the common electrode 228 with the insulating film 236, it is possible to suppress the common electrode 228 from being corroded.

Example 1

FIGS. 23 to 26 show examples in which the display device according to the embodiment is applied to an electronic device. In this embodiment, a case where the present invention is applied to a smart phone as an electronic apparatus will be described.

Figure 23:
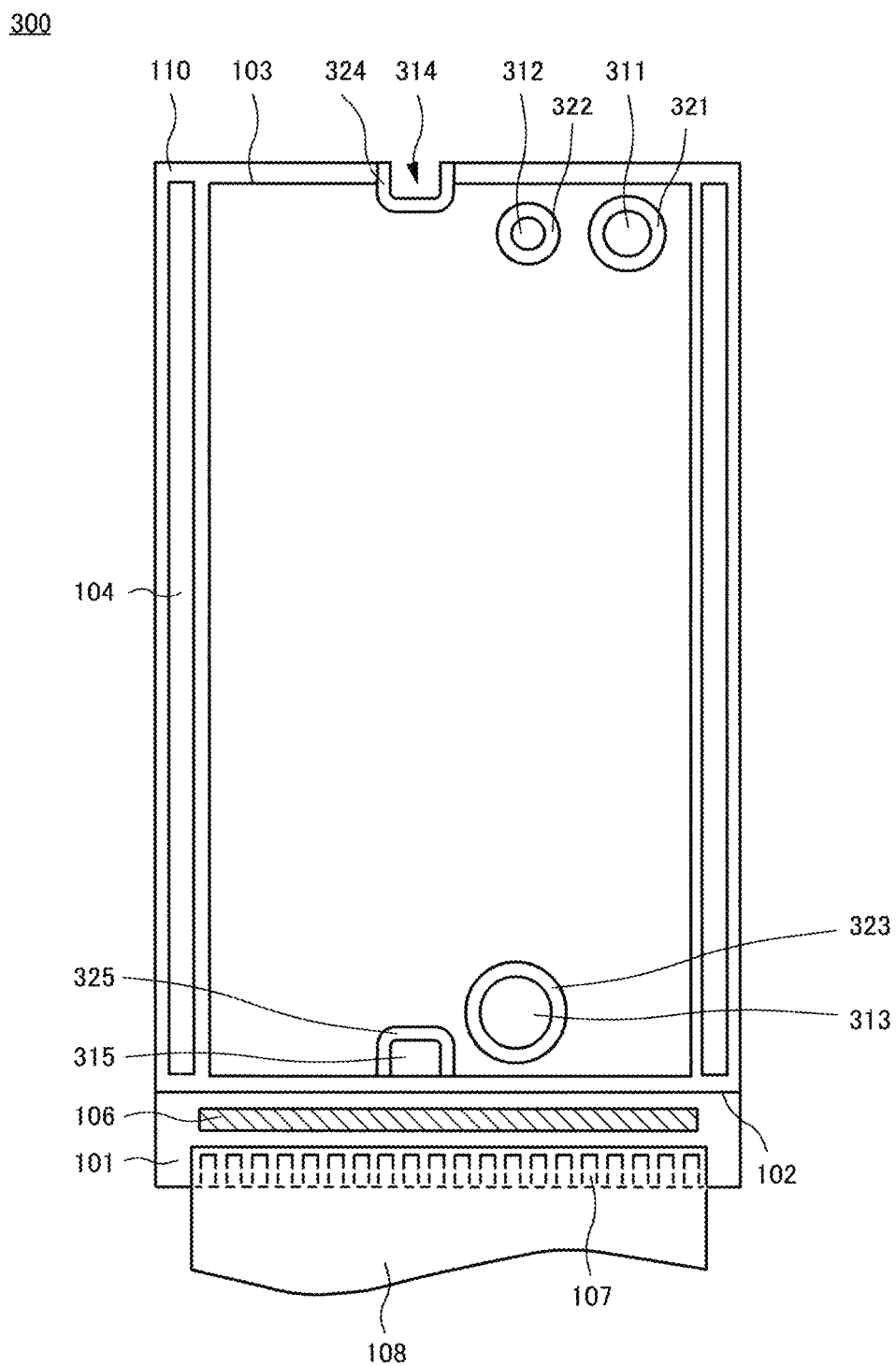
FIG. 23 is a schematic view showing the configuration of the display device according to one embodiment of the present invention.

FIG. 23 shows a schematic view of a display device 300 according to this embodiment. The display device 300 shown in FIG. 23 includes the display region 103, the driver IC 106, the terminal 107, and the flexible printed circuit board 108 on the substrate 101.

In the display region 103, through holes 311, 312 and 313 are provided. The through hole 311 is provided with a region 321 surrounding the through hole 311. The through hole 312 and the through hole 313 are also provided with a region 322 and a region 323, respectively, which surround the through hole. The region 321, the region 322, and the region 323 are provided with a sealing region in which at least two layers of inorganic insulating layer are in contact with each other. By providing the sealing region, as described in the first embodiment, it is possible to suppress moisture and oxygen from entering. As a result, it is possible to suppress degradation of the light-emitting element provided in the display region 103.

The display region 103 is further provided with notches 314 and 315. The notch 314 is provided with a region 324 surrounding the notch 314. The notches 314, 315 are provided with a region 325 surrounding the notch 315. The region 325 is provided with at least two layers of inorganic insulating layer contacting the sealing region. By providing the sealing region, as described in the second embodiment, it is possible to suppress moisture and oxygen from entering. As a result, it is possible to suppress degradation of the light-emitting element provided in the display region 103.

Figure 24:
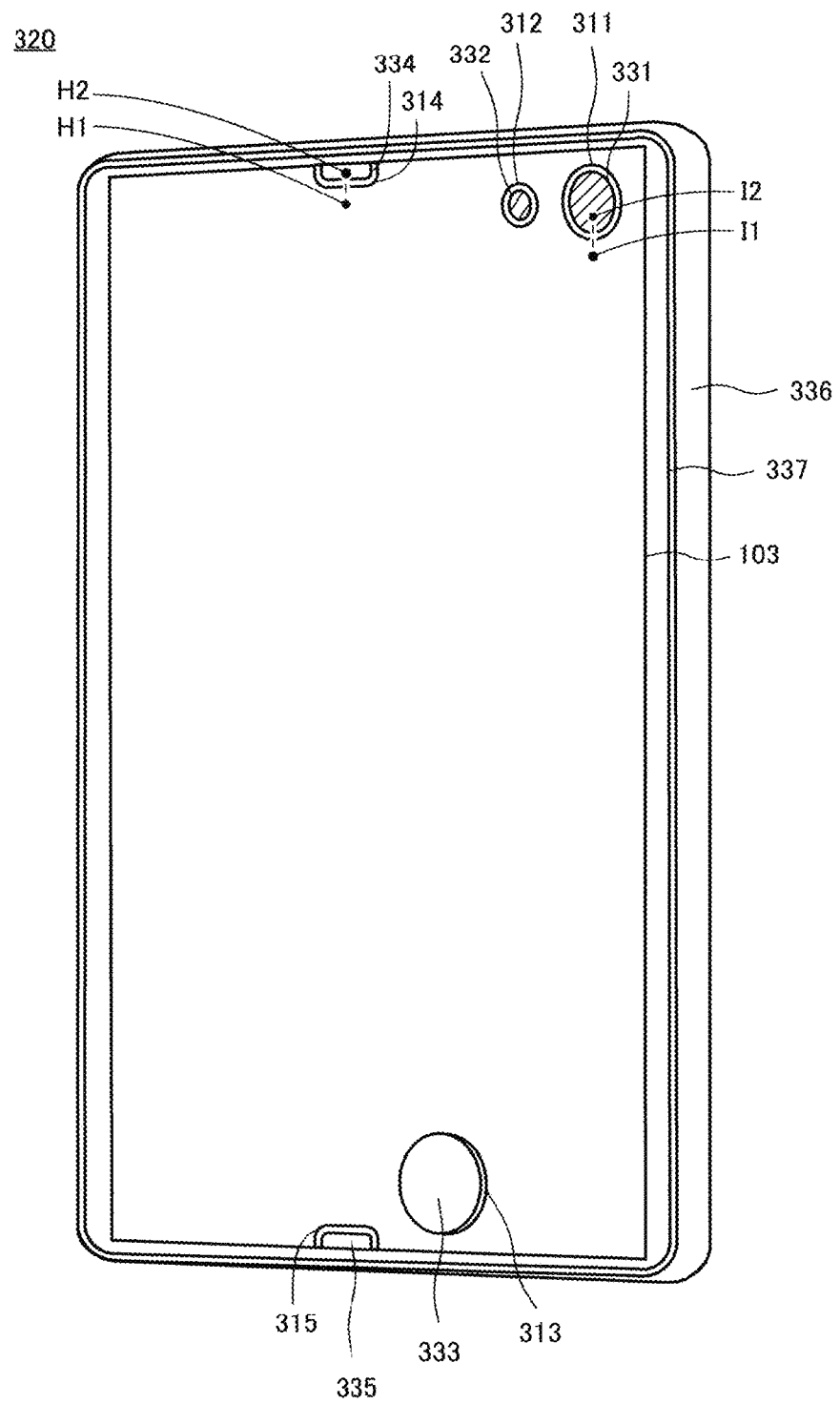
FIG. 24 is a schematic view showing the configuration of the display device according to one embodiment of the present invention.

FIG. 24 shows an exemplary application of the display device 300 shown in FIG. 23 to a smart phone 320.

The smart phone 320 shown in FIG. 24 includes the display device 300, a housing 336, a cover member 337, a physical key 333, a camera module 331, an illuminance sensor 332, a speaker 334, and a microphone 335. In FIG. 23, the display region 103 of the display device 300 is shown.

In the display region 103 of the display device 300, the camera module 331 is fitted into the through hole 311, the illuminance sensor 332 is fitted into the through hole 312, and the physical key 333 is fitted into the through hole 313. The camera module 331 and the illuminance sensor 332 are covered with the cover member 337, and the physical key 333 is not covered with the cover member 337. For example, since the through hole 313 provided with the physical key 333 is not covered with the cover member 337, side of the through hole 313 is exposed. The side of the through hole 313 not covered with the cover member 337 is preferably provided with the organic resin or the inorganic film having moisture-proof properties and oxygen-proof properties as described with reference to FIGS. 10 and 16.

In the display region 103, the notches 314 and 315 are provided. The speaker 334 is fitted into the notch 314, and the microphone 335 is fitted into the notch 315. The speaker 334 and the microphone 335 are not covered by the cover member 337. The side of the notch 315 which is not covered with the cover member 337 is preferably provided with the organic resin or the inorganic film having moisture-proof properties and oxygen-proof properties as described with reference to FIGS. 10 and 16.

For example, if the illuminance sensor 332 is fitted into through a through hole 152, the diameter of the through hole 312 is 3000 μm, and the diameter of the region 322 surrounding the through hole is 800 μm. In this case, the non-display width of the display region 103 is 4600 micrometers. When the camera module 331 is fitted to the through hole 311, the diameter of the through hole 311 is 4000 μm, and the diameter of the region 321 surrounding the through hole is 900 μm. In this case, the non-display width in display region is 5800 micrometers. When the through hole 313 is provided with the physical key 333, the diameter of a through hole 154 is 10000 μm, and the diameter of the region 323 surrounding the through hole 313 is 1550 μm. In this case, the non-display width of the display region 103 may be 13100 micrometers.

Figure 25:
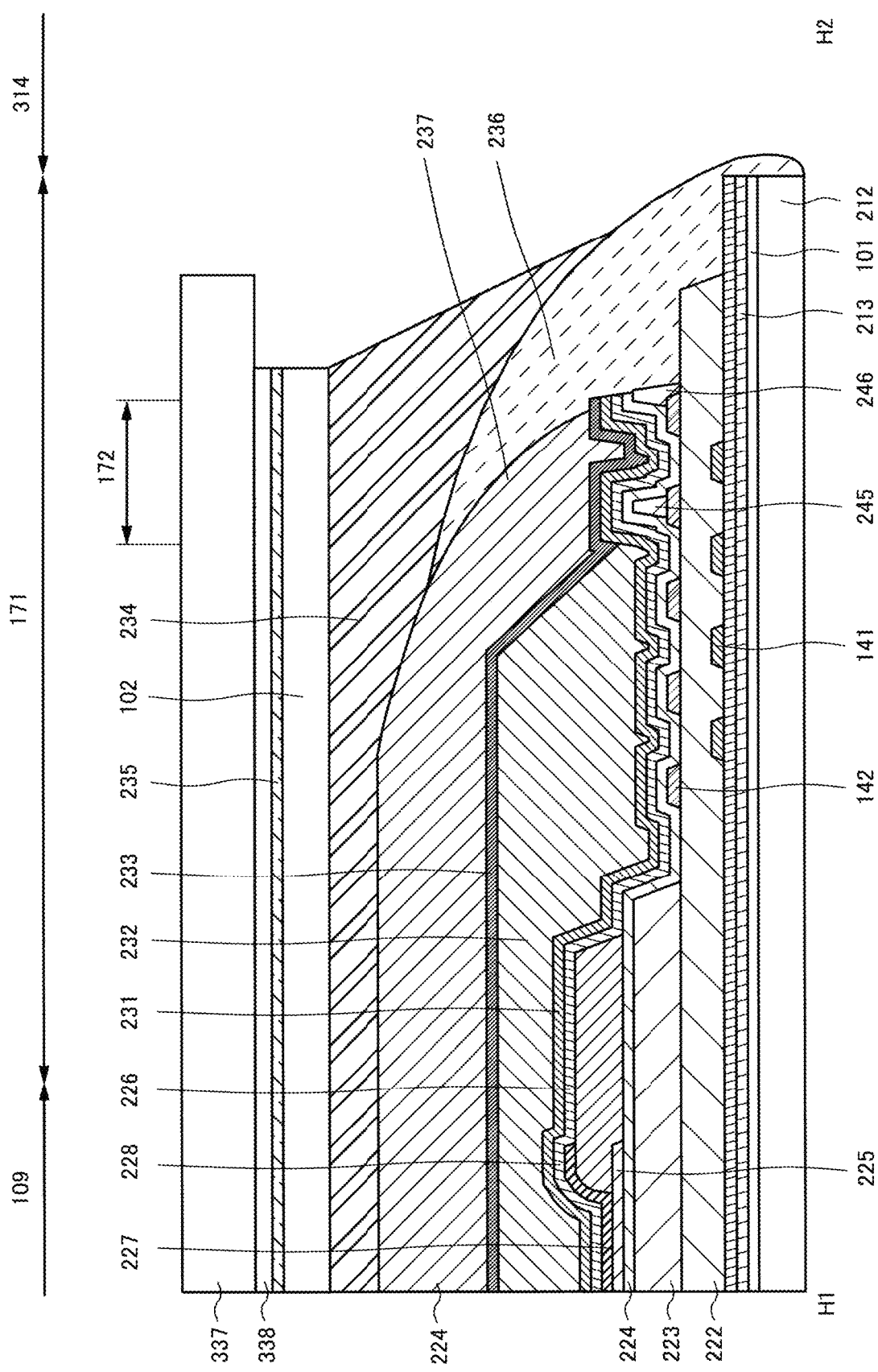
FIG. 25 is a cross-sectional view taken along line H1-H2 of the display region shown in FIG. 24.
Figure 26:
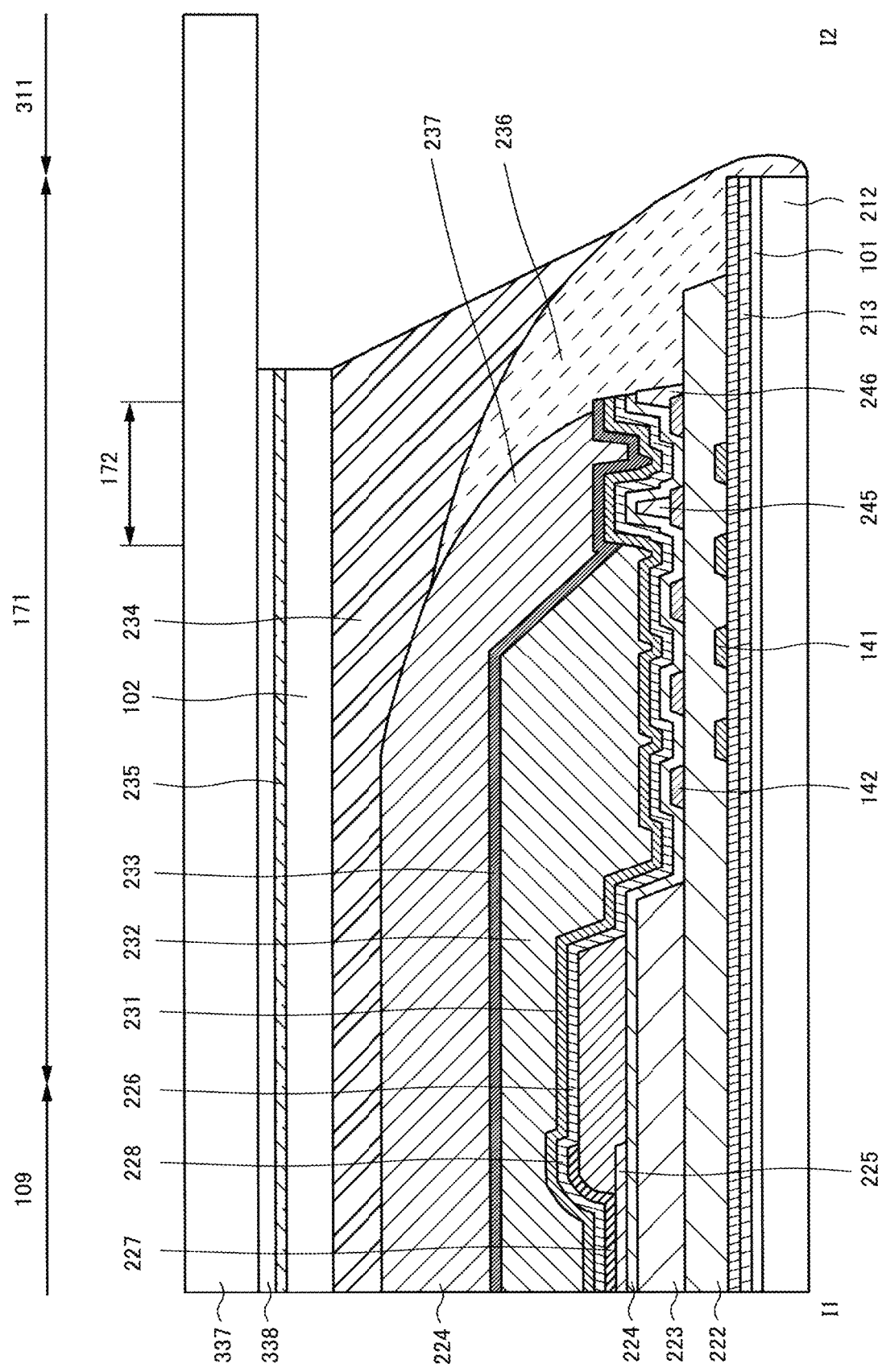
FIG. 26 is a cross-sectional view taken along line B1-B2 of the display region shown in FIG. 24.

FIG. 25 shows a configuration of a cross section of the smart phone 320 shown in FIG. 24 taken along an H1-H2 line, and FIG. 26 shows a configuration of a cross section of the smart phone 320 shown in FIG. 24 taken along an I1-I2 line.

As shown in FIGS. 25 and 26, the cover member 337 is provided on the substrate 102 of the display device via an adhesive member 338. The cover member 337 has a function of protecting the display device from external shocks. A touch sensor may be provided on the surface of the cover member 337 facing the adhesive member 338. Although not particularly illustrated, the touch sensor may be provided on the inorganic insulating layer 233.

In the notch 314 shown in FIG. 25, the speaker 334 is arranged. Therefore, the cover member 337 is not provided in the notch 314. On the other hand, the camera module 331 is arranged in the through hole 311 shown in FIG. 26. Therefore, the cover member 337 is also provided in the through hole 311 to protect the camera module 331. Since the notch 315 shown in FIG. 24 is provided with the microphone 335, the cover member 337 is provided so as not to overlap with the microphone 335. Since the through hole 312 is provided with the illuminance sensor 332, the cover member is also provided in the through hole 312 so as to protect the illuminance sensor 332.

In the smart phone 320 according to this embodiment, components such as the camera module 331 and the illuminance sensor 332 can be provided in the display region 103. As described above, according to the display device 300 according to the embodiment, the degree of flexibility of the external design of the smart phone 320 can be increased. Note that the notch and the through hole can be provided as appropriate in the display region, and the number and size are not particularly limited. There is no particular limitation on components provided in the notch and the through hole.

It is also within the scope of the present invention that a person skilled in the art adds, deletes, or changes designs of components, or adds, omits, or changes conditions of steps as appropriate based on the display device described as an embodiment and an embodiment of the present invention as long as the gist of the present invention is provided. The embodiments described above can be combined with each other to the extent that there is no technical contradiction.

It is to be understood that other effects different from those provided by aspects of the embodiments described above are obvious from the description in this specification or can be readily predicted by those skilled in the art and are naturally provided by the present invention.

What is claimed is:

1. A display device comprising:
   a substrate;
   a display region including a plurality of pixels on the substrate, each of the plurality of pixels including a light-emitting element;
   a sealing film covering the plurality of pixels, and stacking a first inorganic insulating layer, an organic insulating layer, and a second inorganic insulating layer in order from the light-emitting element;
   a through hole provided in the substrate; and
   a first region around the through hole, wherein
   the first region includes a second region in which the first inorganic insulating layer and the second inorganic insulating layer are in contact with each other,
   ends of the first inorganic insulating layer and the second inorganic insulating layer are between the plurality of pixels and an end of the through hole, and
   the ends of the first inorganic insulating layer and the second inorganic insulating layer are not aligned with the end of the through hole in a planar view.

2. The display device according to claim 1, further comprising a protruding portion protruding from the substrate towards the first inorganic insulating layer, wherein
   the protruding portion is between the plurality of pixels and the end of the through hole, and
   the protruding portion is covered with the first inorganic insulating layer and the second inorganic insulating layer.

3. The display device according to claim 2, wherein
   the protruding portion is not covered with the organic insulating layer.

4. The display device according to claim 1, further comprising:
   a plurality of scan lines; and
   a plurality of signal lines intersecting the plurality of scan lines, wherein
   a part of the plurality of scan lines or a part of the plurality of signal lines overlap with the first region, and
   the light-emitting element is not overlap with the first region.

5. The display device according to claim 1, wherein
   the light-emitting element includes a first electrode, a light-emitting layer, and a second electrode, and an end portion of the second electrode is in contact with the first inorganic insulating layer in the second region.

6. The display device according to claim 1, wherein a side surface of the end of the through hole is covered by an insulating material.

7. The display device according to claim 1, wherein a plurality of through holes including the through hole are provided in the substrate.

8. A display device comprising:
a substrate;
a display region including a plurality of pixels on the substrate, each of the plurality of pixels including a light-emitting element;
a sealing film covering the plurality of pixels, and stacking a first inorganic insulating layer, an organic insulating layer, and a second inorganic insulating layer in order from the light-emitting element;
a notch provided in the substrate; and
a first region around the notch, wherein
the first region includes a second region in which the first inorganic insulating layer and the second inorganic insulating layer are in contact with each other,
ends of the first inorganic insulating layer and the second inorganic insulating layer are between the plurality of pixels and an end of the notch, and
the ends of the first inorganic insulating layer and the second inorganic insulating layer are not aligned with the end of the notch in a planar view.

9. The display device according to claim 8, further comprising a protruding portion protruding from the substrate towards the first inorganic insulating layer, wherein the protruding portion is between the plurality of pixels and the end of the notch, and
the protruding portion is covered with the first inorganic insulating layer and the second inorganic insulating layer.

10. The display device according to claim 9, wherein the protruding portion is not covered with the organic insulating layer.

11. The display device according to claim 8, further comprising:
a plurality of scan lines; and
a plurality of signal lines intersecting the plurality of scan lines, wherein
a part of the plurality of scan lines or a part of the plurality of signal lines overlap with the first region, and
the light-emitting element is not overlap with the first region.

12. The display device according to claim 8, wherein the light-emitting element includes a first electrode, a light-emitting layer, and a second electrode, and
the second electrode is in contact with the first inorganic insulating layer in the second region.

13. The display device according to claim 8, wherein a side surface of the end of the notch is covered by an insulating material.

14. The display device according to claim 8, wherein a plurality of notches including the notch are provided in the substrate.

* * * * *